(12) United States Patent
Ohkawa

(10) Patent No.: US 7,405,757 B2
(45) Date of Patent: Jul. 29, 2008

(54) IMAGE SENSOR AND IMAGE SENSOR MODULE

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 595 days.

(21) Appl. No.: 11/023,302

(22) Filed: Dec. 28, 2004

(65) Prior Publication Data

US 2005/0151175 A1 Jul. 14, 2005

Related U.S. Application Data

(63) Continuation of application No. PCT/JP03/09342, filed on Jul. 23, 2003.

(30) Foreign Application Priority Data

Jul. 23, 2002 (JP) ............................. 2002-214477

(51) Int. Cl.
*H04N 3/14* (2006.01)
*H04N 5/335* (2006.01)
(52) U.S. Cl. ...................... 348/294; 348/308
(58) Field of Classification Search ......... 348/294–324; 250/208.1; 257/292, 72, 500
See application file for complete search history.

(56) References Cited

U.S. PATENT DOCUMENTS

| 5,432,363 | A | * | 7/1995 | Kamisaka et al. ........... 257/233 |
| 5,432,364 | A | * | 7/1995 | Ohki et al. .................. 257/239 |
| 6,084,259 | A | | 7/2000 | Kwon et al. |
| 6,392,261 | B1 | * | 5/2002 | Hatano ....................... 257/229 |
| 6,472,255 | B1 | * | 10/2002 | Hatano et al. ............... 438/144 |
| 6,670,990 | B1 | | 12/2003 | Kochi et al. |
| 2001/0042818 | A1 | | 11/2001 | Hatano et al. |
| 2003/0228736 | A1 | * | 12/2003 | Kimura ....................... 438/286 |
| 2004/0017496 | A1 | * | 1/2004 | Koizumi et al. ............. 348/308 |
| 2004/0065808 | A1 | | 4/2004 | Kochi et al. |

FOREIGN PATENT DOCUMENTS

| EP | 0 789 399 A2 | 8/1997 |
| EP | 0 789 399 A3 | 8/1997 |
| EP | 0 905 788 A2 | 3/1999 |

(Continued)

OTHER PUBLICATIONS

European Search Report dated Feb. 6, 2008, Application No. 03765367.2 - 1235.

*Primary Examiner*—Lin Ye
*Assistant Examiner*—Yogesh Aggarwal
(74) *Attorney, Agent, or Firm*—Westerman, Hattori, Daniels & Adrian, LLP.

(57) ABSTRACT

An image sensor is provided that can be made compact, low power consuming, and operative at high speed without degrading image quality and read-out speed. The image sensor includes a pixel cell having a photo diode 31 and a reset transistor 32 connected to a power supply, a detection transistor 33 for detecting the signal voltage of the photo diode 31, a selection transistor 34 for selecting the detection transistor 33 and reading the signal voltage therefrom; a peripheral circuit 12 having MOS transistors; and an input/output circuit 13 having MOS transistors. The gate dielectric films 60A of the reset transistor 32 and the detection transistor 33 are formed thicker than the gate dielectric film of the selection transistor 34.

2 Claims, 24 Drawing Sheets

FOREIGN PATENT DOCUMENTS

| | | |
|---|---|---|
| EP | 1 592 608 A2 | 11/2005 |
| JP | 03125474 A * | 5/1991 |
| JP | 2000-224495 | 8/2000 |
| JP | 2000-357688 A | 12/2000 |
| KR | 2002-0034316 | 5/2002 |

* cited by examiner

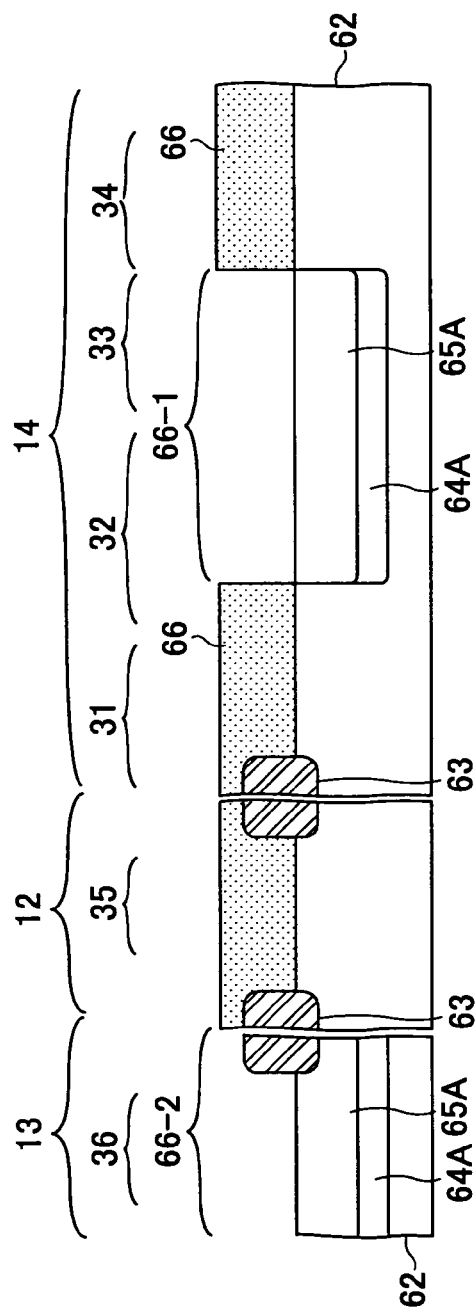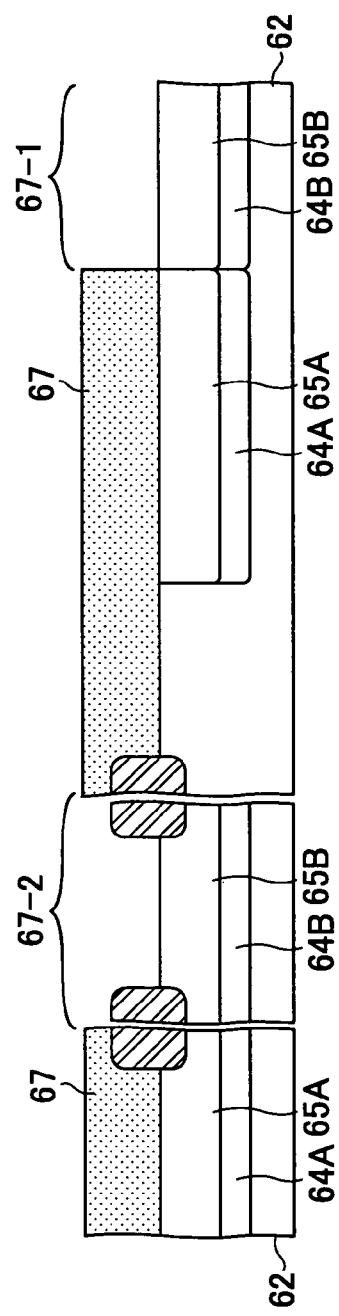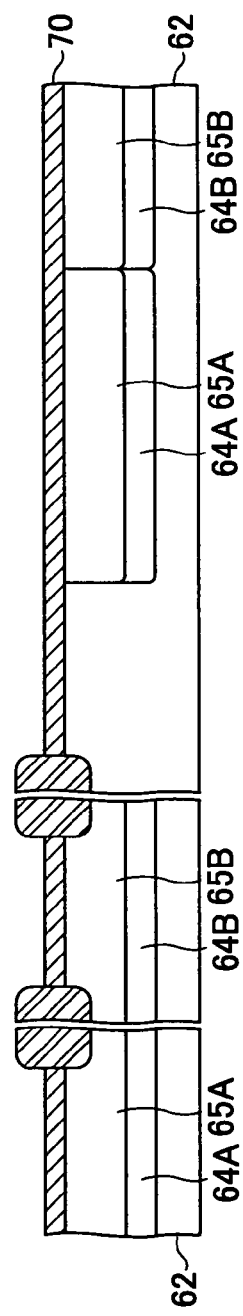

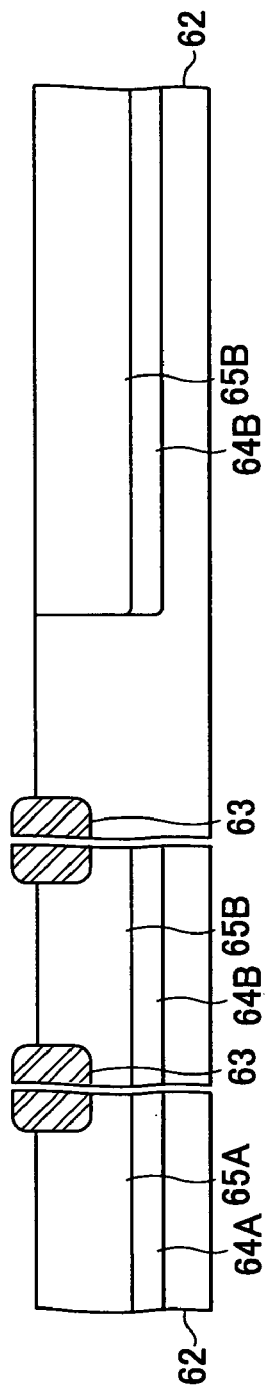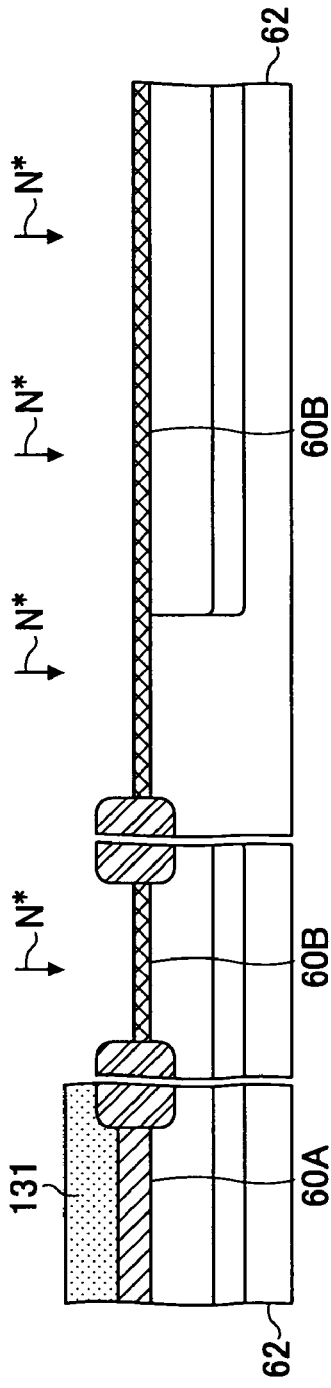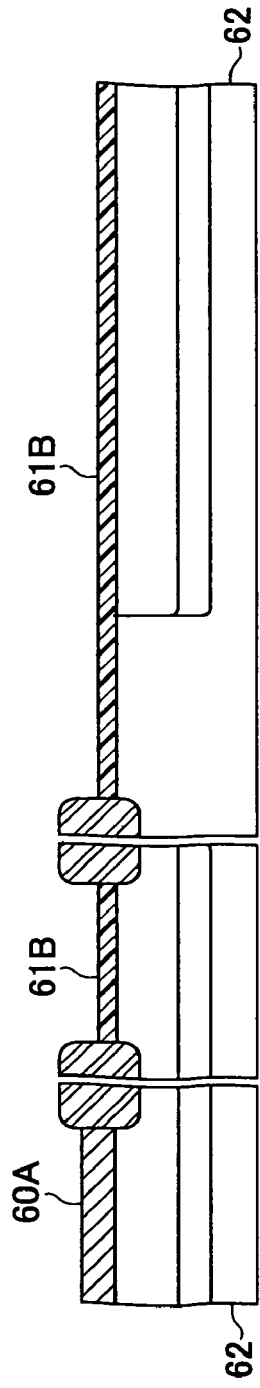

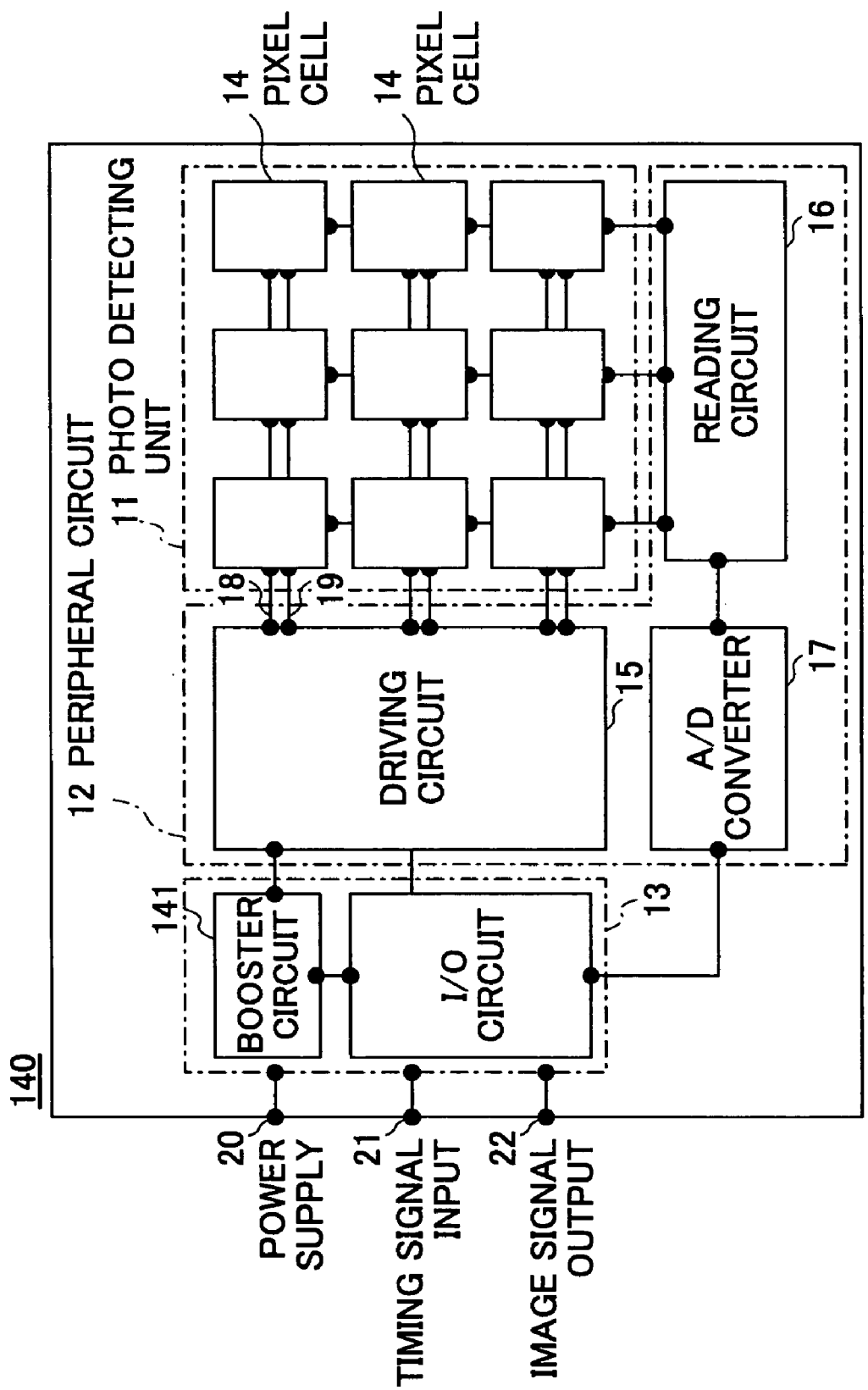

IMAGE SENSOR AND IMAGE SENSOR MODULE

CROSS-REFERENCES TO RELATED APPLICATIONS

This application is a U.S. continuation application filed under 35 USC 111(a) claiming benefit under 35 USC 120 and 365(c) of PCT application JP2003/09342, filed on Jul. 23, 2003.

BACKGROUND OF THE INVENTION

1. Field of the Invention

The present invention relates to a semiconductor apparatus and a fabrication method thereof, and more particularly, to a small CMOS image sensor of high performance.

A CMOS image sensor is a kind of useful solid imaging devices. Compared with a CCD image sensor that is highly sensitive and of high image quality, a CMOS image sensor is characterized in that it can be driven with a single driving voltage and that its power consumption is about ¹/₁₀ times as large as that of a CCD image sensor. A CMOS image sensor is used for a cellar phone and a handy terminal because of these advantages.

2. Description of the Related Art

In the case of a CMOS image sensor, an imaging element and a signal processing circuit can be formed on the same semiconductor substrate and additionally, the CMOS image sensor can be fabricated in a process in which a semiconductor integrated circuit is fabricated, which is a great advantage of the CMOS image sensor.

FIG. 1 is a block diagram showing the construction of a CMOS image sensor.

As showed in FIG. 1, the CMOS image sensor 200 is constructed by the following: a photo controls the photo detecting unit 201, a reading circuit 203 that reads an amount of light the photo detecting unit 201 detects and converts the amount of light into a digital signal, and so forth. The photo detecting unit 201 is constructed by a large number of pixel cells that is arranged in a matrix such as CIF (common Intermediate Format, 352×288 pixels) and VGA (Video Graphics Array, 640×480 pixels) so that the resolution fits that of a TV telephone and a PC. An image formed on the photo detecting unit 201 is divided into the pixels, and the amount of light on each pixel is converted into a voltage signal.

FIG. 2 is a circuit diagram showing the equivalent circuit of a pixel cell.

As showed in FIG. 2, a pixel cell is constructed by a photo diode 211 that receives a light, generates electricity proportional to the amount of received light by photoelectric conversion, and stores it therein, and three n-channel MOS transistors 212-214 that reads the stored electricity as a voltage signal. The operation of the pixel cell will be described in detail.

In response to a reset signal input to the reset transistor 212, the reset transistor 212 turns on and sets the cathode of the photo diode 211 at a reset voltage (=power supply voltage $V_{dd}$). Electron proportional to the amount of received light is stored in the cathode so that the voltage level of the cathode lowers. In response to a select signal, the select transistor 214 is turned on, and the voltage level of the cathode of the photo diode 211 is output to a reading circuit 203 showed in FIG. 1 through the detect transistor 213 and the select transistor 214.

Subject that the number of electrons generated by the photoelectric effect is equal, the smaller the sum of the junction capacitance of the photo diode 211 and the gate capacitance of the detecting transistor 213 is, the larger the voltage level of the cathode of the photo diode 211 changes. Accordingly, the smaller the junction capacitance of the photo diode 211 and the gate capacitance of the detecting transistor 213 are, the larger the sensitivity to the amount of received light is.

On the other hand, a down-sized CMOS image sensor having even higher resolution and better image quality is desired. To achieve these objects the size of each pixel cell and a driving circuit needs to be reduced.

The scaling rule that simply applies a process of finer rule, however, does not solve the problem completely. If the gate length of a CMOS transistor is reduced in compliance with the scaling rule, the thickness of gate dielectrics needs to be reduced at the same time. For example, the process of 0.35 μm long gate demands a 7-8 nm thick dielectrics; the process of 0.25 μm long gate demands about 5 nm dielectrics; and the process of 0.18 μm long gate demands an about 3 nm thick dielectrics.

The application of a finer rule may involve various problems as discussed below.

If the thickness of gate dielectrics is reduced, a gate leaking current generally increases. Since the gate electrode of the detecting transistor 213 showed in FIG. 2 is connected to the cathode of the photo diode 211, if the gate leaking current of the detecting transistor 213 increases, the gate leaking current damages signal charge accumulated at the cathode. Especially, the gate leaking current increases in the case of a process of less than 0.25 μm in which the thickness of the gate dielectrics becomes 5-2.5 nm. The increased gate leaking current disturbs the true signal generated by photoelectric effect and decreases S/N ratio. Especially when an image is captured in a dim light, the true signal is weak, and the gate leaking current generates a white dot in the dim image and substantially degrades image quality.

If the thickness of the gate dielectrics is reduced, the gate capacitance of the detecting transistor 213 is increased. Because the detecting transistor 213 is connected to the cathode of the photo diode 211, the sum of the junction capacitance of the photo diode 211 and the gate capacitance of the detecting transistor 213 is increased. As described above, the voltage change caused by the signal charge generated by photoelectric effect is reduced, and the sensitivity of the CMOS image sensor to the amount of light is reduced.

It is desired that the cathode of the photo diode 211 be reset by a reset signal of a higher voltage level so as to avoid the effect of dispersion in the reset voltage of each reset transistor. However, the higher the level of the reset signal is, the more the gate leaking current of the reset transistor 212 increases. When the thickness of the gate dielectrics becomes 5 nm or less, the gate leaking current increases and the reliability of the gate dielectrics is degraded.

In a fine rule process, the lightly doped drain (LDD) or the source/drain region is generally formed by a dense shallow As ion layer. Because a substrate of a high impurity density is used, the junction capacitance of depletion layer formed between the source/drain region and the substrate. Consequently, the time required reading a signal voltage by charging and discharging this junction is increased, that is, reading speed is reduced. Especially, in the process of 0.25-0.18 μm rule gate length, a pocket region is often formed under the LDD or the source/drain so as to prevent the depletion layer from extending. Because the pocket is formed by an impurity region of the same conductivity type as the substrate and a high density, the junction capacity is further increased by the depletion layer formed between the source/drain region and the pocket region, and the speed of reading the signal voltage is further reduced.

SUMMARY OF THE INVENTION

Accordingly, it is a general object of the present invention to provide a novel and useful image sensor in which one or more of the problems described above are eliminated. Another and more specific object of the present invention is to provide a small, low-power, high-speed image sensor that captures a high quality image at a high speed.

To achieve one of the objects, an image sensor according to the present invention, includes a reset transistor, a photo diode, wherein said reset transistor and said photo diode are serially connected between a first power supply and a second power supply, a detecting transistor connected to said first power supply that detects a signal of said photo diode, and a selecting transistor that selects said detecting transistor, wherein a gate dielectrics of said detecting transistor is thicker than a gate dielectrics of said selecting transistor.

The gate dielectrics of the detection transistor is thicker than that of the selection transistor. Accordingly, the gate leaking current is reduced so that the signal charge accumulated in the photo diode is held accurately, which results in a reduction in noise. Additionally, since the gate dielectrics is thin, the size of the selection transistor can be reduced and its speed is improved.

The gate dielectrics of the reset transistor may be thicker than the gate dielectrics of the selection transistor. In this case, the voltage of a reset signal can be set at a high level without increasing the gate leaking current. As a result, the dispersion of the reset signal and the change in threshold are reduced, and the reliability of the gate dielectrics is improved.

An image sensor, according to another aspect of the present invention, includes a reset transistor, a photo diode, wherein said reset transistor and said photo diode are serially connected between a first power supply and a second power supply, a detecting transistor connected to said first power supply that detects a signal of said photo diode, a selecting transistor that selects said detecting transistor, and a peripheral transistor constructing a peripheral circuit, wherein a gate dielectrics of said detection transistor is thicker than a gate dielectrics of said peripheral transistor.

In addition to the effect of the detection transistor, since the gate dielectrics of the peripheral circuit is thin, the size of the transistor of the peripheral circuit can be reduced and its speed can be improved.

BRIEF DESCRIPTION OF THE DRAWINGS

FIGS. 7A-7K are schematic diagrams showing the fabrication process of the CMOS image sensor according to the first embodiment;

FIGS. 14A-14C are schematic diagrams showing the fabrication process of the CMOS image sensor according to the fifth embodiment;

FIG. 15 is a schematic diagram showing the construction of a CMOS image sensor according to the sixth embodiment of the present invention;

DETAILED DESCRIPTION OF THE PREFERRED EMBODIMENTS

Preferred embodiments of the present inventions will be described in detail by reference to the drawings.

Figure 3:
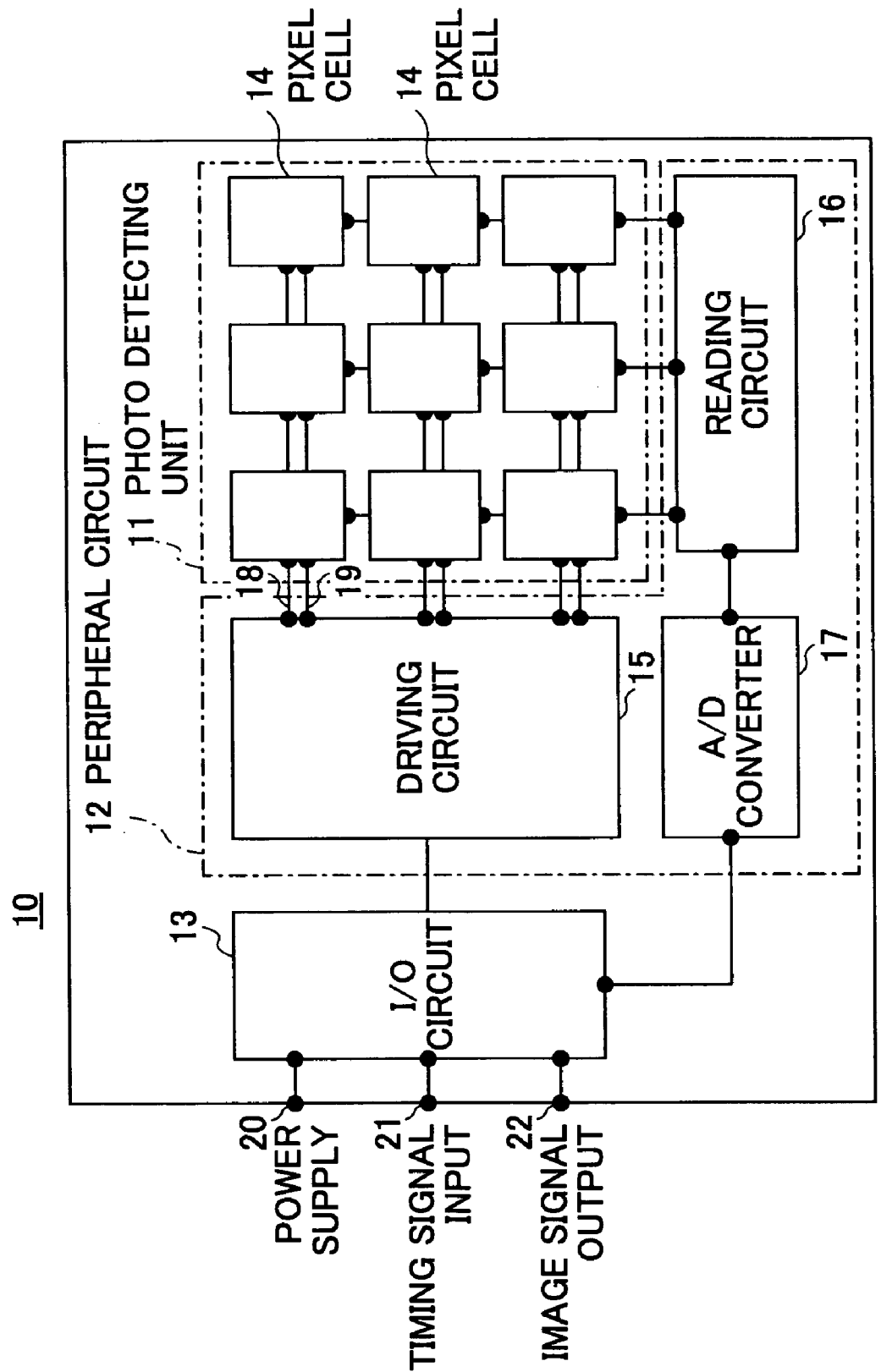
FIG. 3 is a schematic diagram showing the construction of a CMOS image sensor according to an embodiment of the present invention.

FIG. 3 is a schematic diagram showing the construction of a CMOS image sensor according to an embodiment of the present invention.

As showed in FIG. 3, this CMOS image sensor 10 is constructed by the following: a photo detecting unit 11, a peripheral circuit 12, an input/output (I/O) circuit 13, and so forth.

The photo detecting unit 11 is constructed by a number of pixel cells 14 that is disposed in a matrix, for example.

The peripheral circuit 12 is constructed the following: a driving circuit 15 that controls the pixel cells 14, a reading circuit 16 that reads a signal of each pixel cell 14, an analog-to-digital (A/D) converter 17, and so forth. The driving circuit 15 is connected to each pixel cell 14 through a reset signal line 18, a select signal line 19, and so forth, and controls each pixel cell 14 by issuing a reset signal and a select signal. A reading circuit 16 serially reads an analog image signal from a pixel cell 14 selected by the driving circuit 15. The A/D converter 17 converts the analog image signal into a digital image signal and outputs to the I/O circuit 13 and so forth. The peripheral circuit 12 is mainly constructed by logic circuits of CMOS transistors.

The I/O circuit 13 is constructed by the following: an input unit 20 for the power supply voltage, an input unit 20 for the timing signals such as an external clock signal, an output unit 22 for the image signal read from the photo detecting unit 11.

Figure 4:
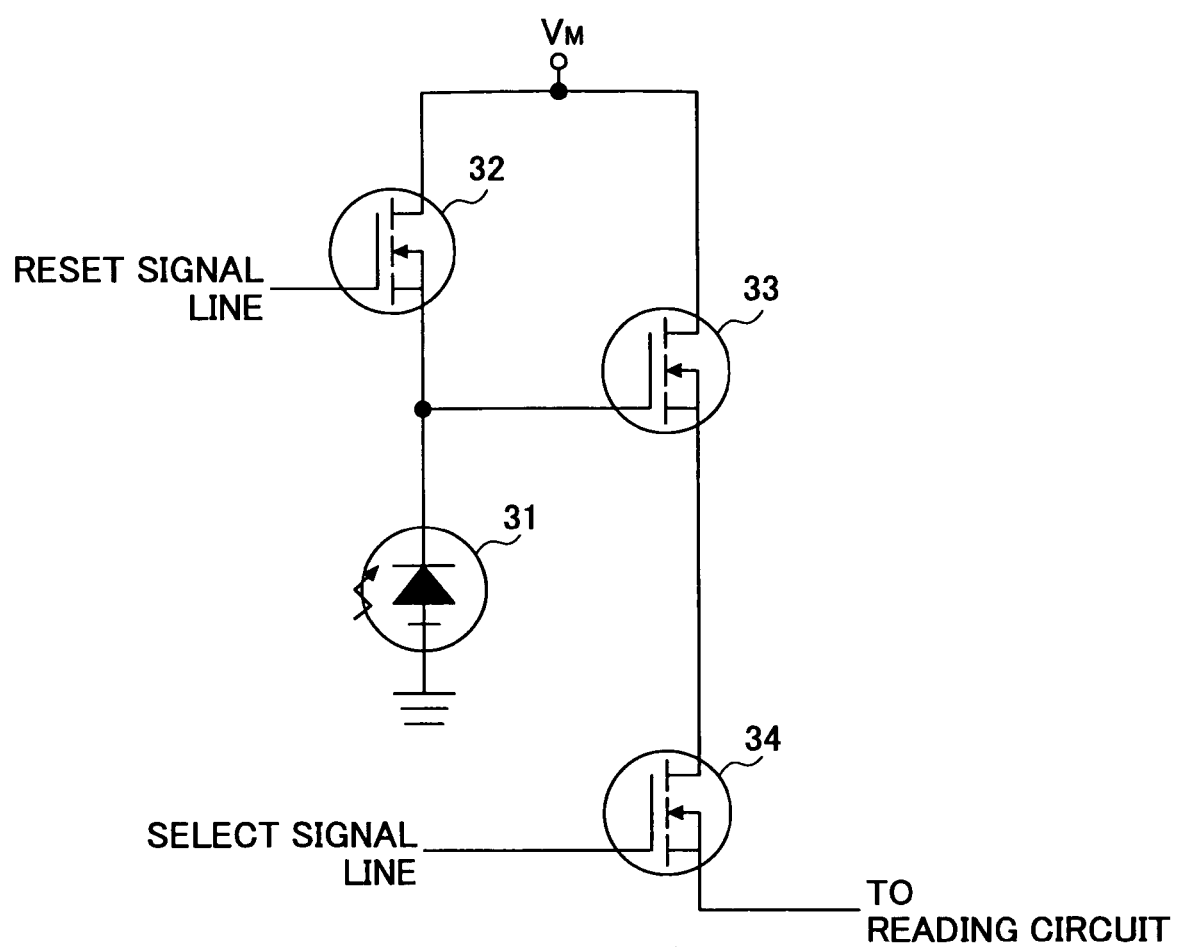
FIG. 4 is a circuit diagram showing the equivalent circuit of a pixel cell of the CMOS image sensor according to an embodiment of the present invention.

FIG. 4 is a circuit diagram showing the equivalent circuit of a pixel cell 14 according to an embodiment of the present invention.

Figure 1:
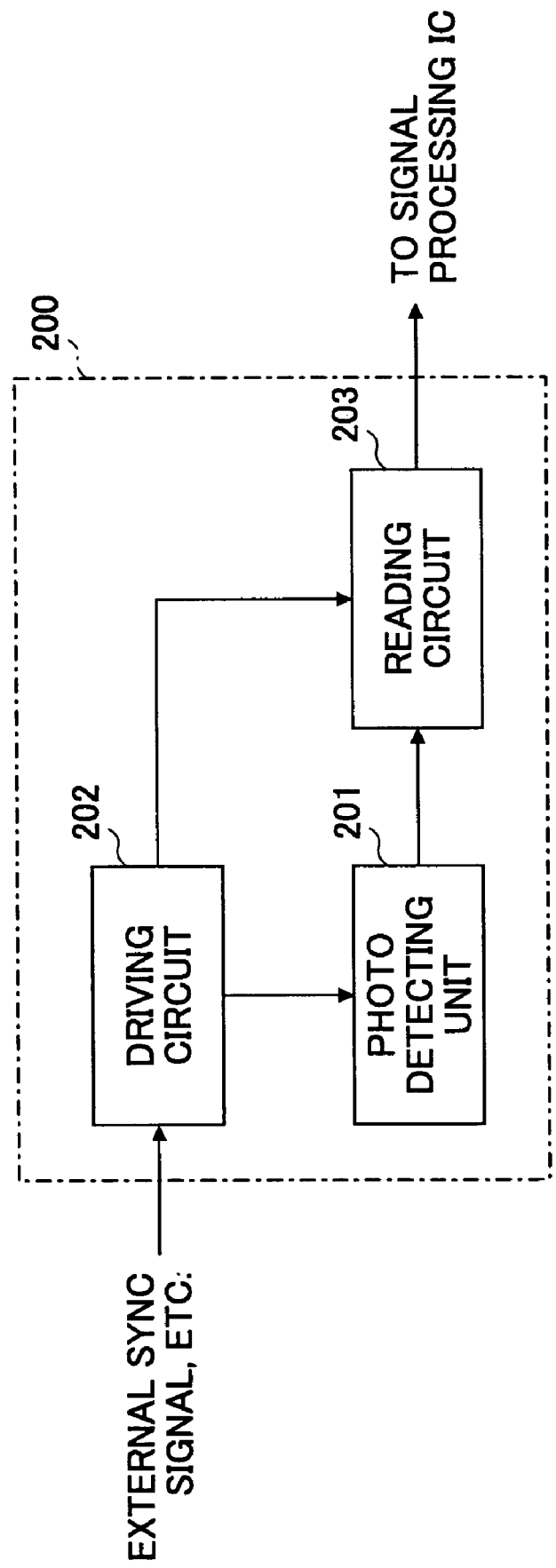
FIG. 1 is a block diagram showing the construction of a CMOS image sensor.
Figure 2:
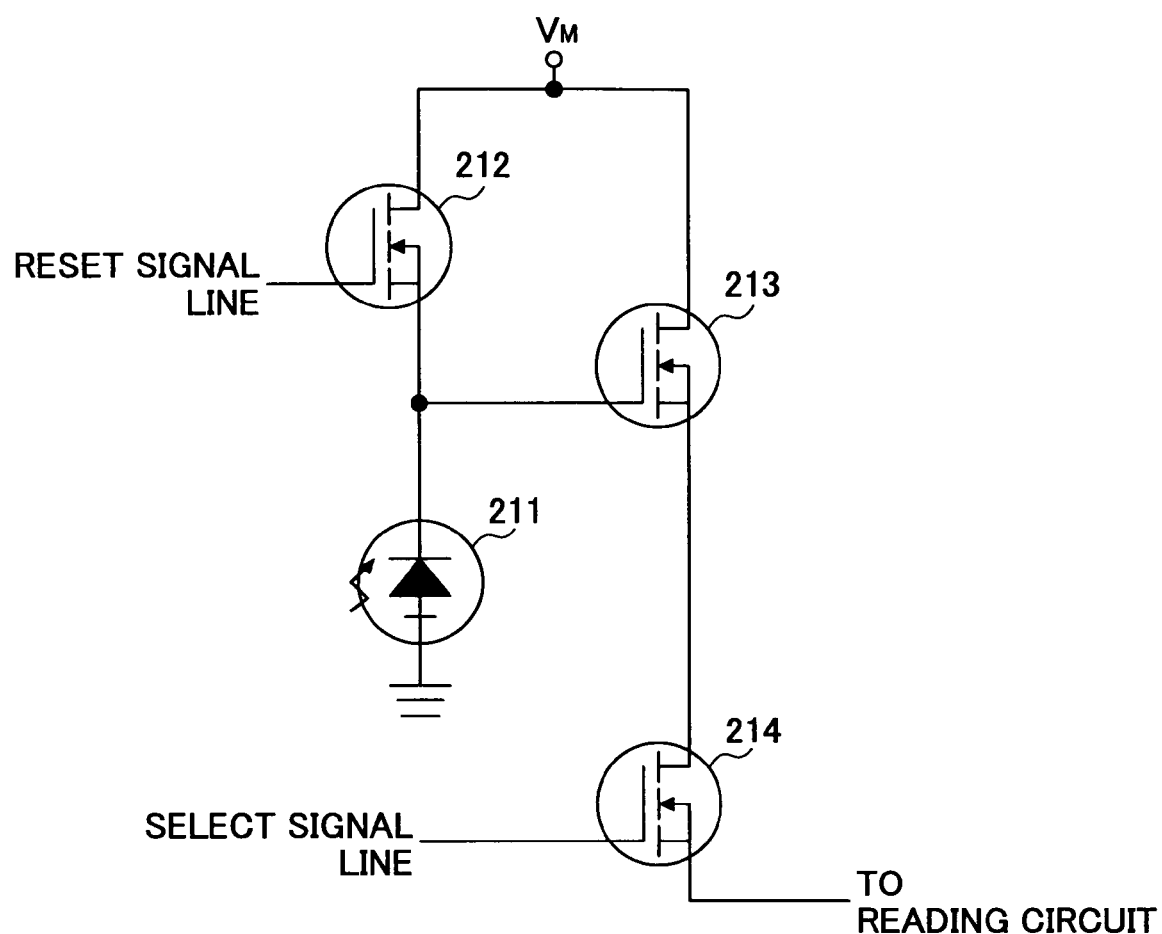
FIG. 2 is a circuit diagram showing the equivalent circuit of a pixel cell.
Figure 5:
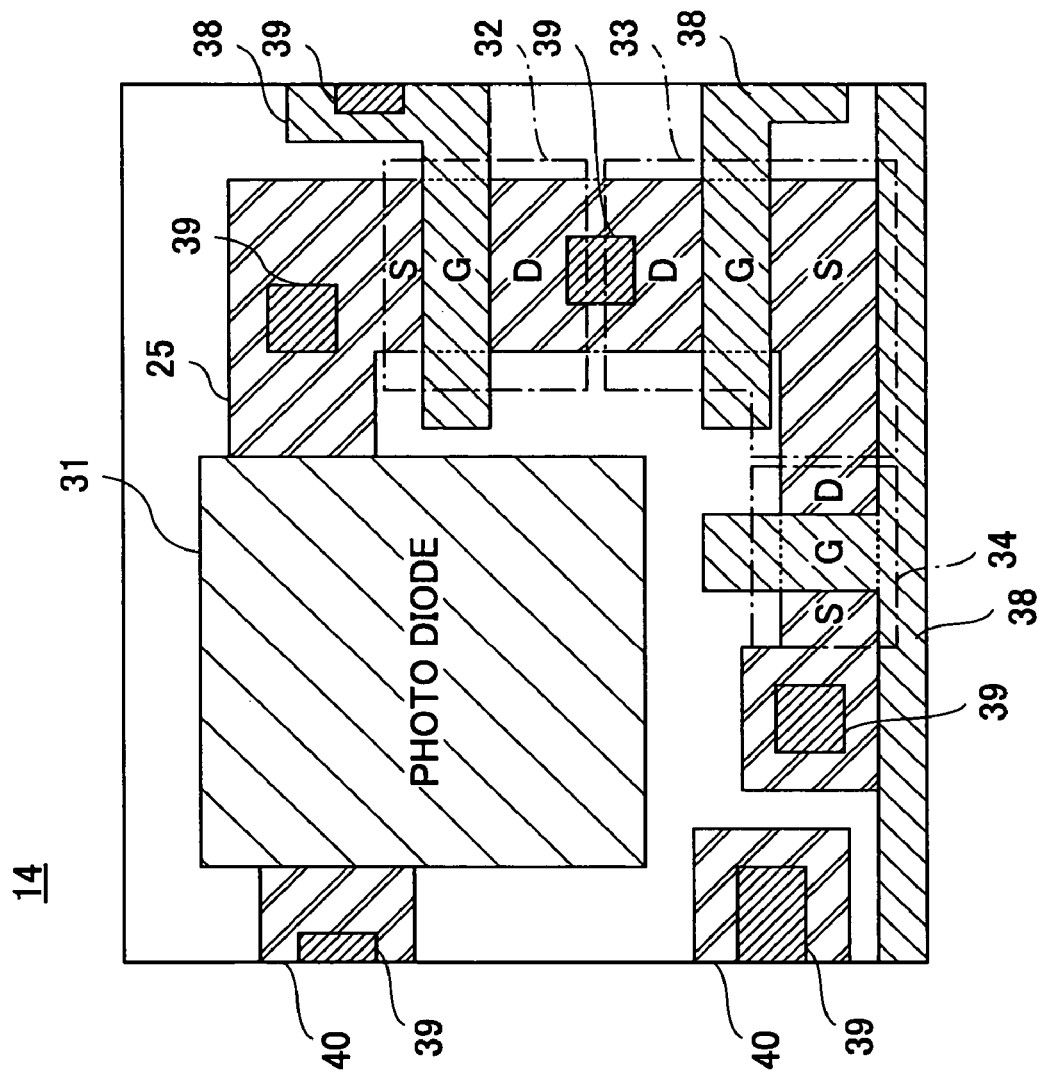
FIG. 5 is a schematic diagram showing the layout of a pixel cell 14 according to an embodiment of the present invention.

FIG. 5 is a schematic diagram showing the layout of a pixel cell 14 according to an embodiment of the present invention. In FIG. 5, "G", "S", and "D" indicates a gate, a source, and a drain, respectively, which is disposed around the position of each character. As showed in FIG. 4, the pixel cell 14 is constructed in the same manner in which the conventional pixel cell of FIG. 2 is constructed. A photo diode 31, a reset transistor 32, a detection transistor 33, and a selection transistor 34 corresponds to the photo diode 211, the reset transistor 212, the detection transistor 213, and the selection transistor 214, respectively. In the following description, the symbols shown in FIGS. 4 and 5 are referred to.

Referring to FIGS. 4 and 5, the pixel cell 14 is formed by the photo diode 31, the reset transistor 32, the detection transistor 33, and the selection transistor 34 formed in an active region 25. Additionally, a gate electrode 38, a contact plug 39, a wiring layer 40, and so forth are formed on the active region 25. The circuit of the pixel cell 14 operates in the same manner as described by reference to FIG. 2 as the related art. Accordingly, the description of the operation is omitted.

Embodiments according to the present invention are described below. Both n-channel MOS transistors and p-channel MOS transistors are formed in the peripheral circuit 12 and in the I/O circuit 13. A description of the p-channel MOS transistors, however, will be omitted since the forming of p-channel MOS transistors is different from the forming of n-channel MOS transistors only in the conductive type of a dopant ion.

First Embodiment

In a CMOS image sensor according to the first embodiment, the gate dielectrics of the reset transistor and the detection transistor is thicker than the dielectrics of the selection transistor and transistors of the peripheral circuit.

Figure 6:
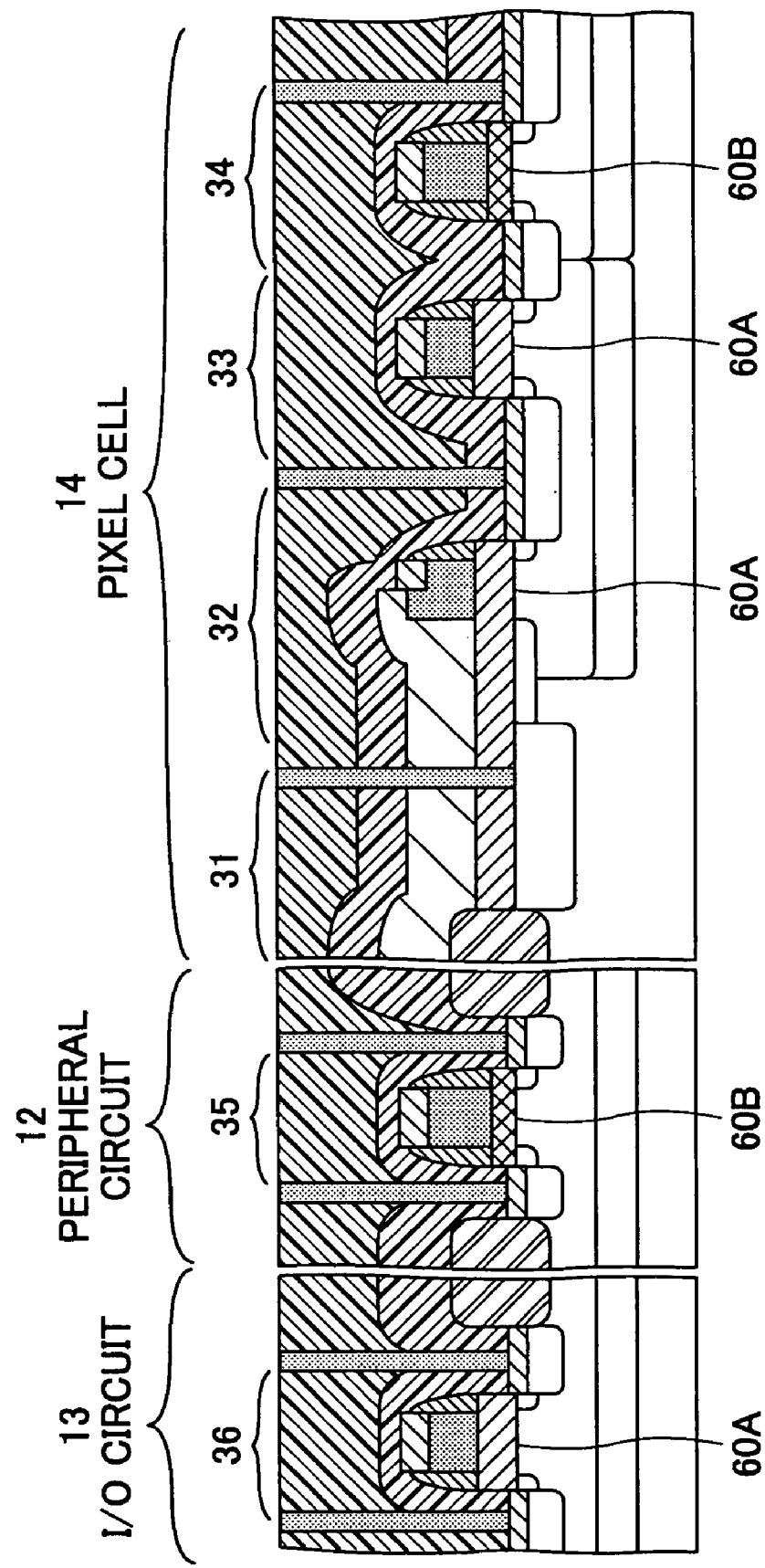
FIG. 6 is a cross section of a CMOS image sensor according to the first embodiment of the present invention.

FIG. 6 is a cross section of the CMOS image sensor according to the first embodiment. The following are showed in FIG. 6: the elements of the pixel cell 14, some of the elements of the peripheral circuit 12, and some of the elements of the I/O circuit 13. FIG. 6 shows the cross-sectional view of the pixel cell 14 cut along the active region 25 showed in FIG. 5 so that all elements in the pixel cell 14 are shown.

Referring to FIG. 6, a CMOS image sensor 50 is constructed by the pixel cell including the photo diode 31 and three n-channel MOS transistors 32-34, the peripheral circuit 12 and the I/O circuit 13 including MOS transistors and so forth. The three n-channel MOS transistors 32-34 are the reset transistor 32, the detection transistor 33, and the selection transistor 34. It is worth noting that the gate dielectrics 60A of the reset transistor 32, the detection transistor 33, and the transistor 36 of the I/O circuit 13 are thicker than the gate dielectrics 60B of the selection transistor 34. On the other hand, thinner gate dielectrics 60B is formed in the selection transistor 34 and the transistor 35 of the peripheral circuit 12 by applying a process of finer rule and their gate length are shorter. However, a transistor of the driving circuit 15 showed in FIG. 3, to which a high voltage reset signal is applied has a thick gate dielectrics 60A. This circuit operates in the same manner as the circuit showed in FIG. 2.

The fabrication process of a CMOS image sensor 50 according to the first embodiment will be described by reference to FIGS. 7A-7K.

FIGS. 7A-7K shows a series of steps by which the CMOS image sensor 50 according to the first embodiment is fabricated.

Referring to FIG. 7A, isolation regions 63 are formed on a p-type silicon substrate 62 by a local oxidation of silicon (LOCOS) method or shallow trench isolation (STI) method.

In the step of FIG. 7A, ions are injected to form well region. The impurity density of the well region 64A forming the reset transistor 32 and the detection transistor 33 of the pixel cell 14 and the transistor 36 of the I/O circuit 13 is set lower than that of the well region 64B forming the selection transistor 34 of the pixel cell 14 and the transistor 35 of the peripheral circuit 12.

Particularly, a resist 66 having openings corresponding to the reset transistor 32, the detection transistor 33, and the transistor 36 of the I/O circuit 13 is formed in a resist process. The well region 64A is formed by injecting p-type dopant ion such as $B^+$ to the openings 66-1 and 66-2 by an ion injection method. For example, the energy of the ion injection is set at 140-300 keV, and the amount of ion injection is set $5\times10^{12}$-$3\times10^{13}$ $cm^{-2}$.

A channel region 65A for controlling a threshold is further formed in the step of FIG. 7A. The amount of the ion injection is set lower than that of the channel region of the selection transistor 34 and the transistor 36 of the peripheral circuit 12. For example, p-type dopant ions such as $B^+$ are injected at energy of 10-30 keV and an amount of $1\times10^{12}$-$1\times10^{13}$ $cm^{-2}$ by the ion injection method.

In the step of FIG. 7B, a well region 64B is formed in the regions where the selection transistor 34 of the pixel cell 14 and the transistor 35 of the peripheral circuit 12. Particularly, a resist 67 having openings corresponding to the selection transistor 34 and the transistor 35 of the peripheral circuit 12 is formed in a resist process. Next, the p-type dopant ions such as $B^+$ are injected to the openings 67-1 and 67-2 by the ion injection method at energy 140-300 keV and an amount of $5\times10^{12}$-$3\times10^{13}$ $cm^{-2}$. Furthermore, a channel region 65B for controlling a threshold is formed using the same resist 67. For example, p-type dopant ions such as $B^+$ are injected by the ion injection method at energy of 10-30 keV and an amount of $5\times10^{12}$-$2\times10^{13}$ $cm^{-2}$.

Figure 7D:
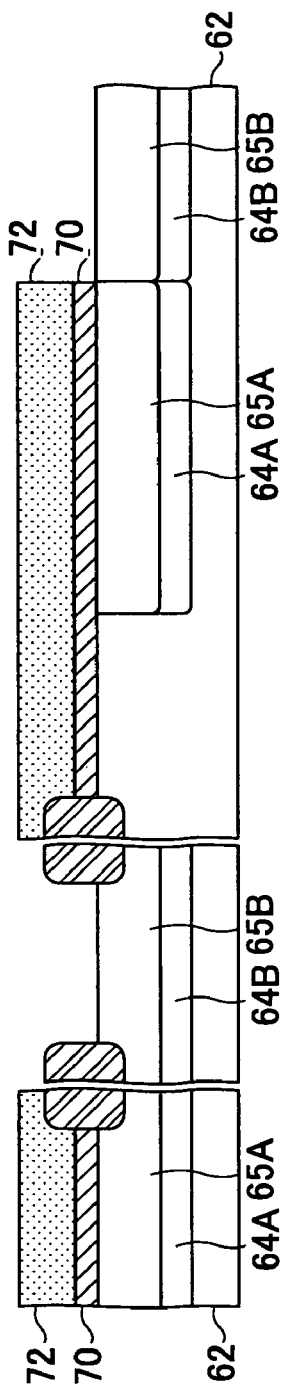
Figure 7E:
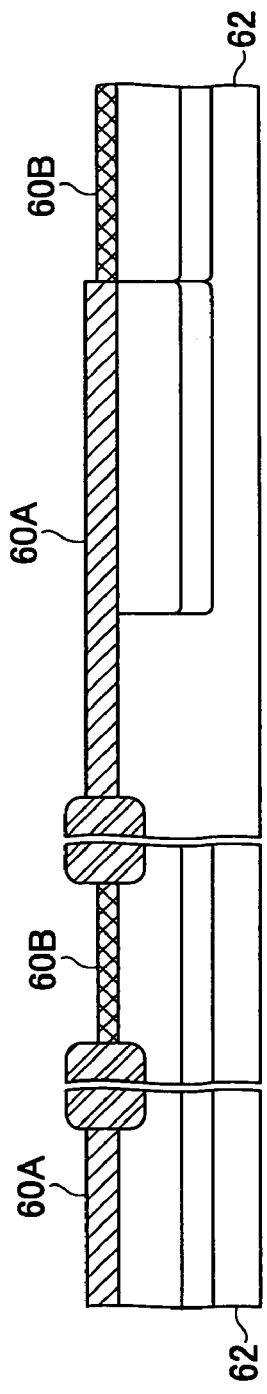
Figure 7F:
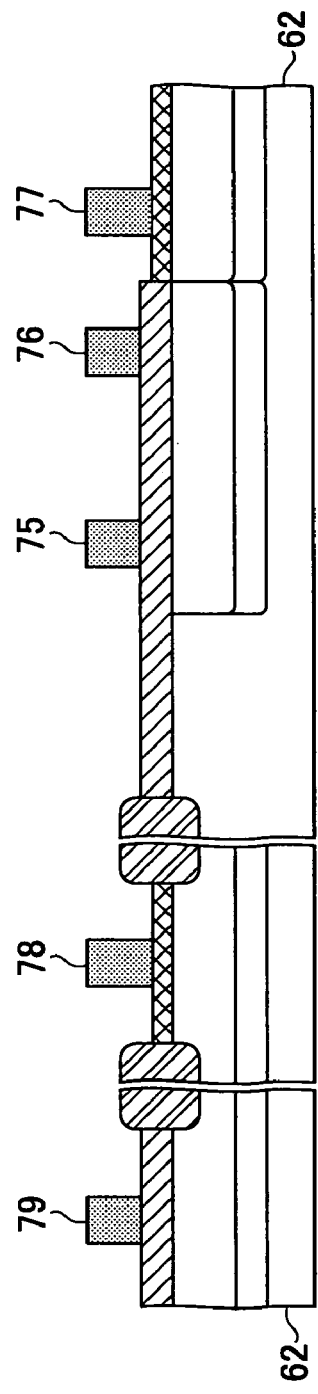
Figure 7G:
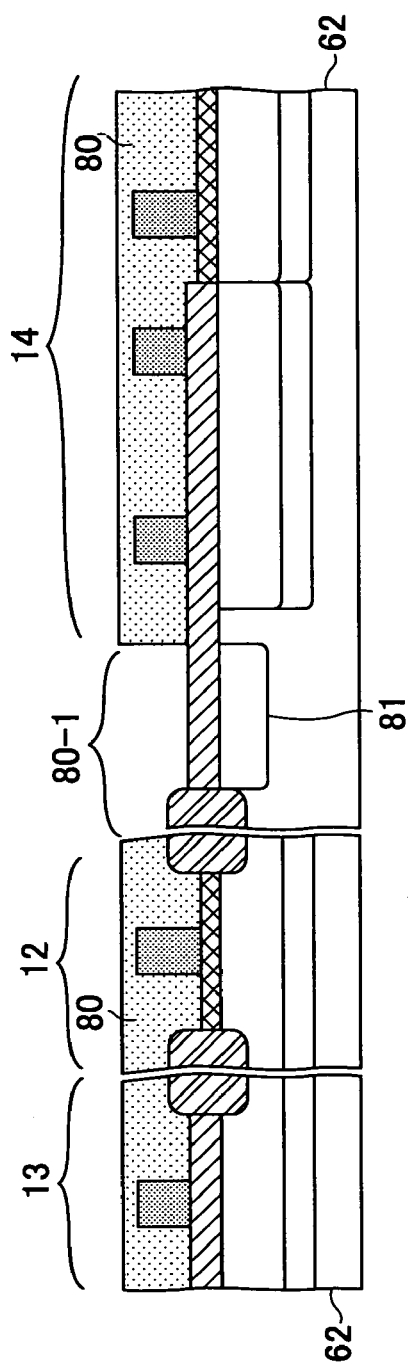
Figure 7H:
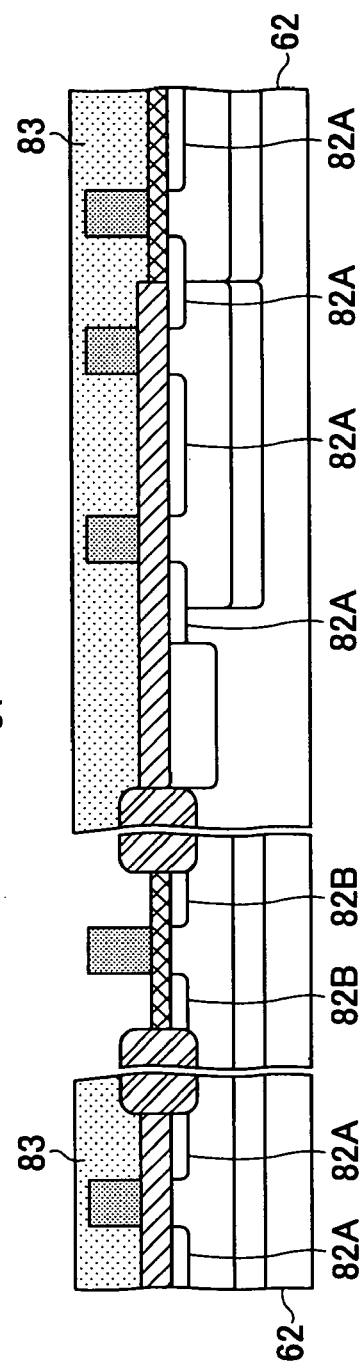
Figure 7I:
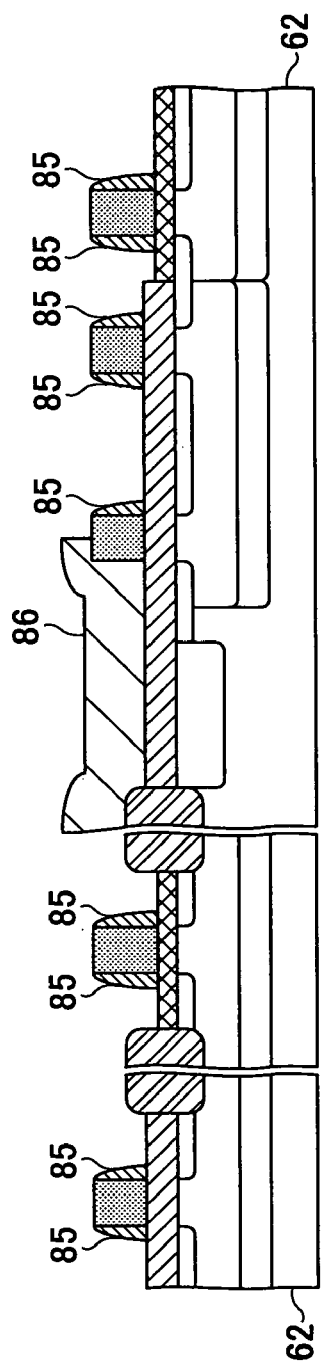

When the channel region 65B for controlling the threshold is formed, the channel region 65B may be limited within 0.2 μm in the horizontal direction from the position at which the outer side of a side wall dielectric film (the side wall dielectric film 85 of the gate electrode 77 formed in the step shown in FIG. 7I) at the drain side of the gate electrode of the selection transistor. The junction capacitance of the drain of the selection transistor 34 can be reduced and the speed of reading operation can be increased.

As described above, if the impurity density of the well region 64A of the reset transistor 32 is lowered, the junction electric field between the drain region and the well region 64A is reduced. Accordingly, the junction leaking current can be reduced and the quality of image can be improved. Additionally, because the junction capacitance is reduced, the sensitivity of the photo diode 31 is improved. If the impurity density of the well region 64A of the detection transistor 33 is reduced, the junction capacitance of the drain region is reduced too, which results in that the operational speed of the detection transistor is increased.

In the step of FIG. 7C, after the resist 67 is removed, native oxide formed on the surface of the structure of FIG. 7B is also removed by HF processing, for example. After rinsing and drying the structure, a silicon oxide layer is formed by thermal oxidation. The substrate is thermally oxidized by a furnace at an atmosphere of dry $O^2$, 800-850° C., for example. Accordingly, a gate dielectrics 70 formed by a silicon oxide of a thickness of 6-8 nm, for example.

Figure 8:
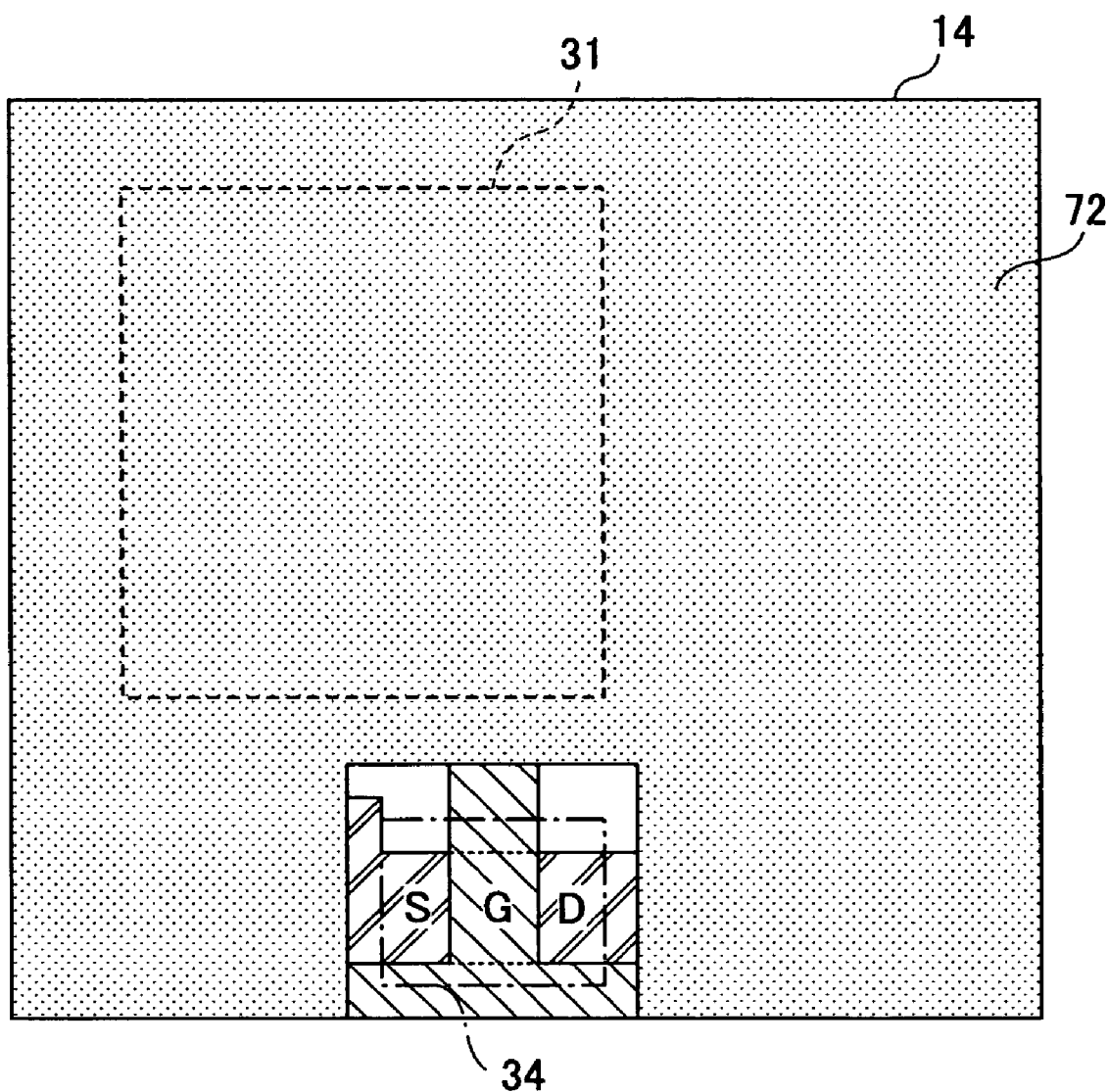
FIG. 8 is a schematic diagram showing the layout of resist to be formed on a pixel cell according to the first embodiment.

Next, in the step of FIG. 7D, regions corresponding to the reset transistor 32, the detection transistor 33, and the photo diode 31 of the pixel cell 14 and the transistor 36 of the I/O circuit 13 are masked by a resist 72 in a resist process. The gate dielectrics of the other regions is removed by the HF processing and persulfuric acid processing. This resist 72 is formed in a manner showed in FIG. 8. FIG. 8 is a schematic diagram showing the layout of the resist 72 formed in the pixel cell 14. Referring to FIG. 8, the resist 72 masks a region other than the selection transistor 34, which prevents the thickness of the field oxide layer of the isolation region 63 from being reduced.

In the step of FIG. 7E, after removing the resist 72, a gate dielectrics formed by a silicon oxide of thickness of 2.5-6 nm is further formed. The resist 72 is removed by combining both a dry process such as plasma ashing and a wet process using resist remover. The residue of the resist on the surface of the silicon substrate is cleaned by the wet process. For example, gate dielectrics 60A made of silicon oxide of a thickness of 6 nm or more in the region where the reset transistor 32 and the detection transistor 33 of the pixel cell and the transistor 36 of the I/O circuit 13 are formed. Likewise, gate dielectrics 60B made of silicon oxide of a thickness of 2.5-6 nm in the region where the other transistors are formed.

Since the gate dielectrics 60A of the reset transistor 32 is thick, the voltage of the reset signal can be set at a high level without increasing the gate leaking current. As a result, it is possible to secure the reliability of the gate dielectrics and reduce the dispersion caused by the dispersion of threshold voltage of the reset transistor 32. The thick gate dielectrics 60A of the detection transistor 33 reduces the gate leaking current so that the signal charge accumulated in the cathode of the photo diode 31 is held accurately. As a result, the image quality is improved.

In the step of FIG. 7F, a poly-silicon layer, which becomes the gate electrodes 75-79, of a thickness of 150-200 nm on the gate dielectrics 60A and 60B by a CVD method, for example. It is possible to additionally form an anti-reflection film made of silicon nitride of a thickness of 10-50 nm by a plasma CVD method, for example. The anti-reflection film improves the accuracy of patterning to form the gate electrode by a photo-lithography process.

Figure 7J:
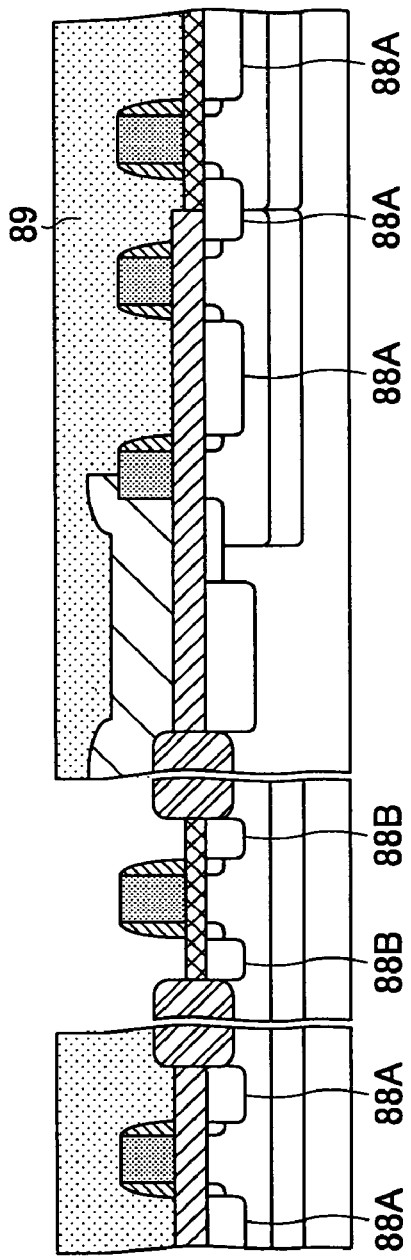

In the step of FIG. 7F, the poly-silicon film in which the n-channel MOS transistors 32-36 are formed is injected with $P^+$ ion and is annealed at about 800° C. to improve its resistance. For example, $P^+$ ion is accelerated up to 10-30 keV and is injected at a density of $1 \times 10^{15}$-$1 \times 10^{16}$ cm$^{-2}$. It is desirable that the ion is injected at a density of $3 \times 10^{15}$-$1 \times 10^{16}$ cm$^{-2}$. This process is effective in that the electric resistance of a portion of the gate electrode of the reset transistor in which silicide is not formed can be reduced. In the case where the P+ ion density of the poly-silicon layer is set at $3 \times 10^{15}$-$1 \times 10^{16}$ cm$^{-2}$, it is possible to form silicon nitride layer or silicon oxide-nitride layer of a thickness of several 10 nm on the poly-silicon layer as the anti-reflection layer. In the steps of FIGS. 7H and 7J, when impurity ions are implemented to form the LDD region and the source/drain region, the anti-reflection layer prevents impurity ions from passing through the gate electrodes 75-79 and arriving at the silicon substrate 62.

The density of P+ injected into the poly-silicon layer in the pixel cell 14 may differ from that in the peripheral circuit 12 and the I/O circuit 13 by the resist process. For example, the density of $P^+$ may be increased up to $6 \times 10^{15}$ cm$^{-2}$ or more only in the pixel cell 14 and decreased down to $6 \times 10^{15}$ cm$^{-2}$ or less in the peripheral circuit 12 and the I/O circuit 13.

In the step of FIG. 7F, gate electrodes 75-79 are formed by etching the poly-silicon layer by the resist process and dry etching by a RIE method (anisotropic etching). The gate length is set depending on the thickness of the gate dielectrics 60A and 60B. For example, when the thickness of the gate dielectrics 60A and 60B is 5 nm, the gate length is set at 0.25 μm or more, and when the thickness of the gate dielectrics 60A and 60B is 3 nm, the gate length is set at 0.18 μm or more. Accordingly, the CMOS image sensor can be down-sized by reducing the size of the pixel cell 14 and the peripheral circuit 12. Chlorinous gas such as $CCl_2F_2$ and $C_2Cl_2F_4$ and a parallel plate type RIE apparatus are used for the dry etching.

Next, in the step of FIG. 7G, photo-resist 80 is formed, but only the region where the photo diode 31 is formed is left exposed. That is, a region other than the region in the pixel cell 14 in which the photo diode 31 is formed is masked with the photo-resist 80 as well as the peripheral circuit 12 and the input/output circuit 13. Next, an n-type diffusion layer 81 of the photo diode 31 is formed by injecting $P^+$ into the opening part 80-1. For example, the ion is injected at an amount of $1 \times 10^{13}$ cm$^{-2}$-$5 \times 10^{15}$ cm$^{-2}$ at an energy range between 10 keV-30 keV, using the ion injection method. As a result, the photo diode 31 having a p-n junction of the p-type substrate and the n-type diffusion layer 81.

Subsequently, in the step of FIG. 7H, a LDD region of n-channel transistor is formed. Impurity ion injected into the peripheral circuit 12 is different from impurity ion injected other region. For example, the peripheral circuit 12 is masked with photo-resist first (not shown), and $P^+$ is injected into the region other than the peripheral circuit 12 thereby to form n-type LDD region 82A. For example, the ion is injected at an amount of $1 \times 10^{13}$ cm$^{-2}$-$1 \times 10^{14}$ cm$^{-2}$ at an energy range between 10 keV-30 keV, using the ion injection method.

In the step of FIG. 7H, the region other than the peripheral circuit 12 is masked with photo-resist 83, and then, $As^+$, or $As^+$ and $P^+$ is injected into the n-channel transistor 35 of the peripheral circuit 12 thereby to form n-type LDD region 82B. For example, the ion is injected at an amount of $1 \times 10^{13}$ cm$^{-2}$-$1 \times 10^{14}$ cm$^{-2}$ at an energy range between 10 keV-30 keV, using the ion injection method. A pocket region may be formed under the LDD region 82B by injecting $B^+$. For example, the ion is injected at an amount of $1 \times 10^{12}$ cm$^{-2}$-$1 \times 10^{13}$ cm$^{-2}$ at an energy range between 30 keV-50 keV, using the ion injection method. After the injection, the substrate is processed by RTP (Rapid Thermal Process) in $N_2$ atmosphere at 900° C.-1000° C. for 10-60 sec.

As described above, the LDD region 82B of the peripheral circuit 12 is formed by injecting $As^+$, or $As^+$ and $P^+$. If the substrate is processed at 1000° C., the density distribution at the bottom end of the LDD region 82B becomes steep since the diffusion factor of $As^+$ in silicon is about one tenth that of $P^+$. Accordingly, a high performance transistor having a steep junction can be formed. On the other hand, the LDD region 82A of the n-channel transistor in the pixel cell 14 is formed with P+. Consequently, the density distribution at the bottom end of the LDD region 82A becomes broad, and the junction capacitance of the depletion layer formed between the LDD region 82A and the substrate 62 is reduced. As a result, the operation speed of the n-channel transistor in the pixel cell 14 is increased. In addition, since the junction capacitance of the photo diode 31 is also reduced, the sensitivity of the photo diode 31 is improved.

Next, in the step of FIG. 7I, the photo-resist is removed from the structure shown in FIG. 7H, and silicon oxide film is deposited such that it covers the structure entirely. For example, the silicon oxide film of 50-150 nm thickness may be deposited using gas containing SiH4 and O2 by CVD method.

In the step of FIG. 7I, gate side wall film 85 is further formed, which supports the gate electrode 75. The silicon oxide film is etched back using photo-resist process and dry etching by RIE method. The gate side wall film 85 is formed. The silicon oxide film 86 are left on the region of the photo diode 31 and on a portion of drain region and gate electrode 75 of the reset transistor 32.

Next, in the step of FIG. 7J, the source/drain region of the n-channel transistor of the pixel cell 14 and the input/output circuit 13 is formed. First, in photo-resist process, the region of the photo diode 31 and the transistor 35 of the peripheral circuit 12 is masked with photo-resist (not shown). Then, n-type source/drain region 88A is formed by injecting P+. For example, the ion is injected at an amount of $5\times10^{14}$ cm$^{-2}$-$5\times10^{15}$ cm$^{-2}$ at an energy range between 10 keV-30 keV, using the ion injection method.

In the step of FIG. 7J, in a further photo-resist process, only region in which transistors are formed in the peripheral circuit 12 is left exposed. Then, As+ is injected by the ion injection method thereby to form n-type source/drain region 88B. For example, the ion is injected at an amount of $1\times10^{15}$ cm$^{-2}$-$5\times10^{15}$ cm$^{-2}$ at an energy range between 10 keV-40 keV. The source/drain region formed as described above exhibits the same effect as the above LDD region.

Figure 7K:
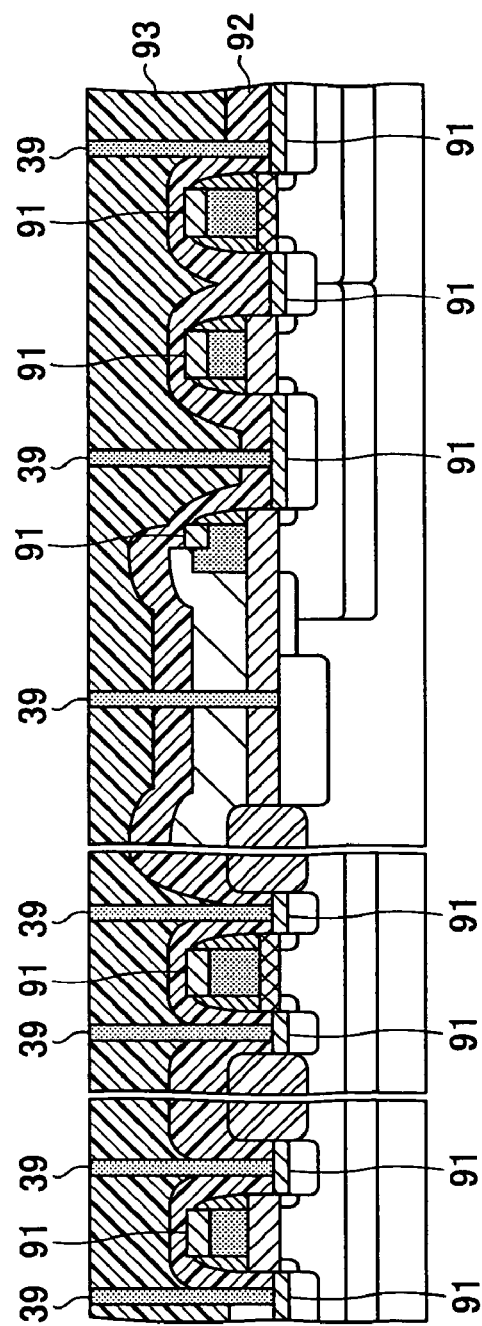

In the step of FIG. 7K, Silicide is formed in the contact region of the source drain region and the gate electrode 75. Specifically, natural oxidation film on the surface of the substrate over the source/drain region and the gate electrode is removed using HF. Metal layer such as Ti, Co, and Ta of 5-30 nm thick is formed over the substrate using spattering method, for example. Subsequently, the substrate is processed using the RTA process at 650° C.-750° C. for 30-90 sec. This thermal process forms contact layer 91 made of Silicide such as TiSi2, CoSi2, TaSi2, by causing the metal layer to react with silicon. Silicide is not formed on the region where silicon oxide has been formed. Next, the metal that has not formed the Silicide is removed by wet processing. Then, the substrate is processed by RTA processing at about 800° C. for 30 sec, for example.

In the step of FIG. 7K, a dielectric film 92 is formed such that the entire surface of the substrate is covered. Specifically, using plasma CVD method, a dielectric film such as silicon oxide film, silicon oxynitride film, silicon nitride film, or any combination thereof is formed. For example, a silicon oxide film of 10-100 nm thickness may be formed such that the entire surface of the substrate is covered, and then, a silicon nitride film of 50-200 nm is formed thereon.

In the step of FIG. 7K, using the plasma CVD method, an inter-layer dielectric film 93 made of silicon oxide film of 100-1500 nm thickness is formed. The formed inter-layer dielectric film 93 is made flat by CMP method.

In the step of FIG. 7K, contact holes are formed using the photo-resist process and the dry etching process. The contact holes are filed by metal film such as W deposited by CVD method, and the W film on the surface of inter-layer dielectric film 93 is removed using the CMP method. Contact plugs 39 are formed, and metal wiring is also formed in usual CMOS process thereby to form the CMOS image sensor 50.

As described above, according to the present embodiment, the gate dielectric film 60B of the selection transistor 34 in the pixel cell 14 can be made thin. Consequently, the selection transistor 34 can be made compact in compliance with the scaling rule, for example. The pixel cell can be integrated at even more large scale, and the image quality, processing speed, and power consumption thereof can be improved. On the other hand, the gate dielectric film 60A of the reset transistor 32 and the detection transistor 33 of the pixel cell 14 and the gate dielectric film 60A of the transistor 36 of the input/output circuit 13 is thicker than the gate dielectric film 60B of the selection transistor 34 and that of the transistor 35 in the peripheral circuit 12. Consequently, the gate leakage current of the reset transistor can be prevented from being increased, and the voltage of a reset signal can be maintained at a higher level. Because the gate leakage current is prevented from being increased, the detection transistor 33 can retain the signal charge stored in the cathode of the photo diode 31 at high precision. As a result, image quality can be prevented from being degraded.

Furthermore, the gate dielectric film 60B of the transistor 35 in the peripheral circuit 12 is made thin. Consequently, the transistor 35 can be made compact in compliance with the scaling rule, and the peripheral circuit 12 can be even more integrated.

Because the LDD region 82B and the source/drain region of the transistor 35 in the peripheral circuit 12 are formed by As+, or As+ and P+. According to this arrangement, the transistor 35 becomes of high quality by forming steep junction.

The LDD region 82A and the source/drain region 88A of the n-channel transistors 32-34 in the pixel cell 14 are formed by P+. The junction capacitance of the depletion layer formed between the LDD region 82 and the p-type silicon substrate 62, and between the source/drain region 88A and the p-type silicon substrate 62 is reduced. Consequently, the n-channel transistors 32-34 can operate at higher speed. Additionally, the junction capacitance of the photo diode 31 is also reduced resulting in improved sensitivity of the photo diode.

Second Embodiment

A CMOS image sensor according to a second embodiment has the detection transistor, reset transistor, and selection transistor the gate dielectric film of which is thicker than that of the transistors in the peripheral circuit.

Figure 9:
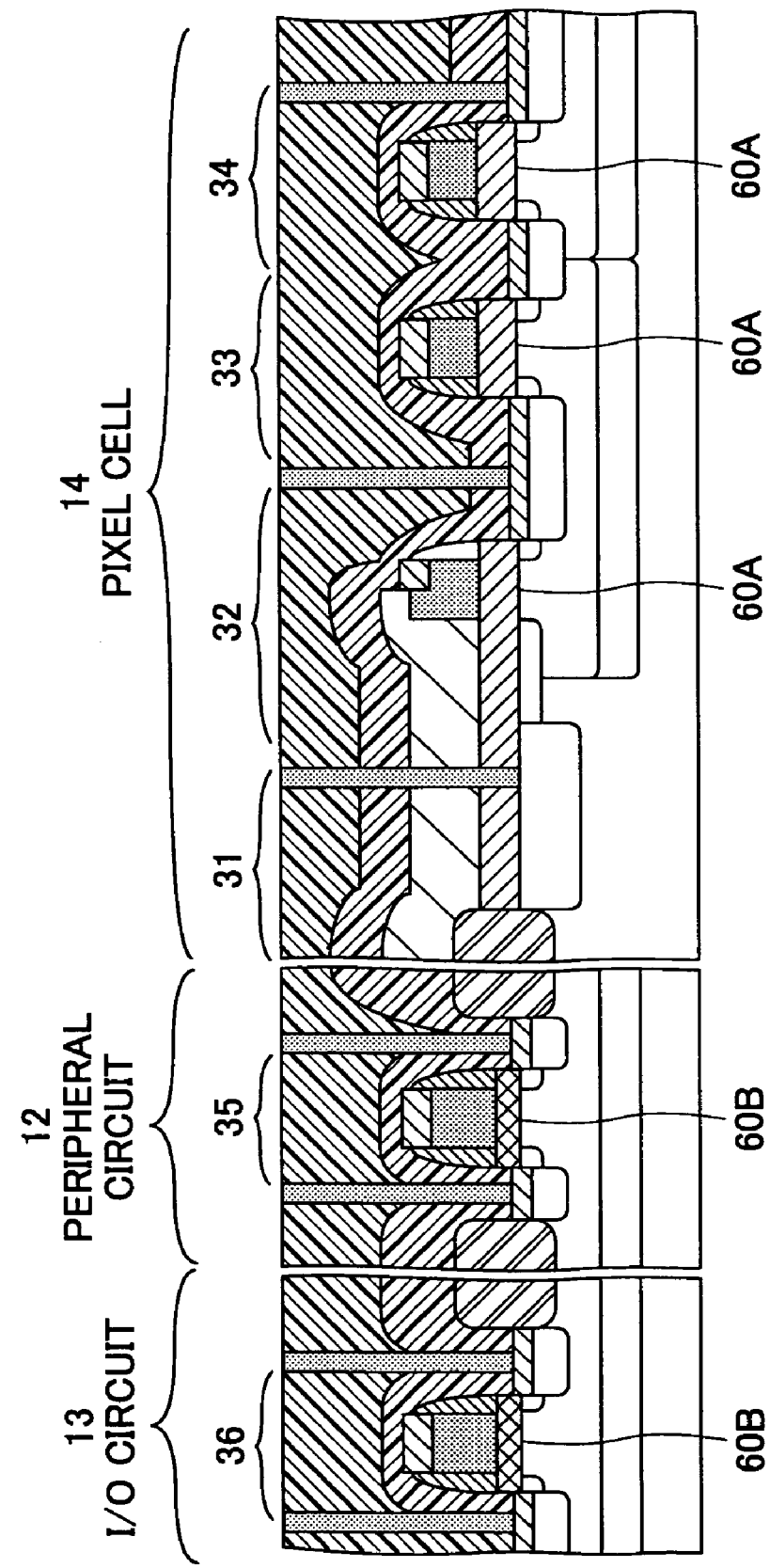
FIG. 9 is a cross section showing a CMOS image sensor according to the second embodiment of the present invention.

FIG. 9 illustrates the cross-section of the CMOS image sensor according to the present embodiment. FIG. 9 shows components in the pixel cell 14 and some components of the peripheral circuit 12 and the input/output circuit 13. In the following description, components corresponding to those that are described above are referred to by the same reference symbols, and their description is omitted.

Referring to FIG. 9, the CMOS image sensor 100 includes a pixel cell 14 having a photo diode 31 and three n-channel MOS transistors 32-34, a peripheral circuit 12 having MOS transistors 35, 36, and an input/output circuit 13. The CMOS image sensor 100 is characterized in that the reset transistor 32, the detection transistor 33, and the selection transistor 34 have a thick gate dielectric film 60A. On the other hand, the gate dielectric film 60B of the MOS transistors in the peripheral circuit 12 and the input/output circuit 13, which is formed by the application of finer rule process, is thin and short. However, it is noted that, among transistors in the peripheral circuit 12, the transistor of the driving circuit 15 shown in FIG. 3, for example, to which a high-voltage reset signal is applied has a thick gate dielectric film 60A.

Such construction prevents the gate leakage current from being increased even when a select signal is applied to the gate electrode 77 of the selection transistor 34, the voltage of the select signal being higher than the power supply voltage.

As a result, the signal voltage can be prevented from varying pixel by pixel according to the difference of threshold voltage of selection transistors.

The manufacturing process of the CMOS image sensor according to the present embodiment is described with reference to FIGS. 10A-10D.

FIGS. 10A-10D shows the manufacturing steps of the CMOS image sensor according to the present embodiment.

Figure 10A:
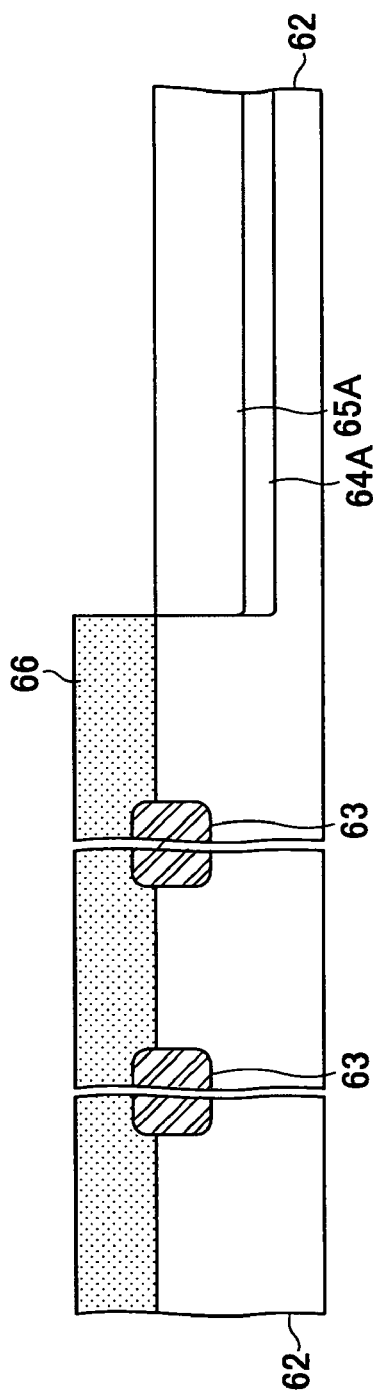
FIGS. 10A-10D are schematic diagrams showing the fabrication process of the CMOS image sensor according to the second embodiment.

In the step shown in FIG. 10A, isolation regions 63 are formed in the same manner as the step according to the first embodiment shown in FIG. 7A. Then, ion is injected thereby to form well regions. The impurity density of the well regions 64A for three transistors 32-34 in a pixel cell 14 is set lower than the impurity density of the well region 64B of the transistors 35, 36 in the peripheral circuit 12 and the input/output circuit 13. More specifically, a photo-resist 66 is formed in a photo-resist process, but regions corresponding to the three transistors 32-34 are left exposed. Then, well regions are formed by injecting p-type dopant ion such as B+ to the exposed regions. The condition of ion injection is similar to that of the first embodiment described with reference to FIG. 7A. If the selection transistor 34 has the well region 64A with low impurity density, the junction capacitance of its drain region becomes low, resulting in high operating speed. For the reset transistor and the detection transistor, similar effects are obtained to those described above for the first embodiment. A channel region 65A for controlling the threshold value is formed before removing the photo-resist 66 in the same manner as the first embodiment.

Figure 10B:
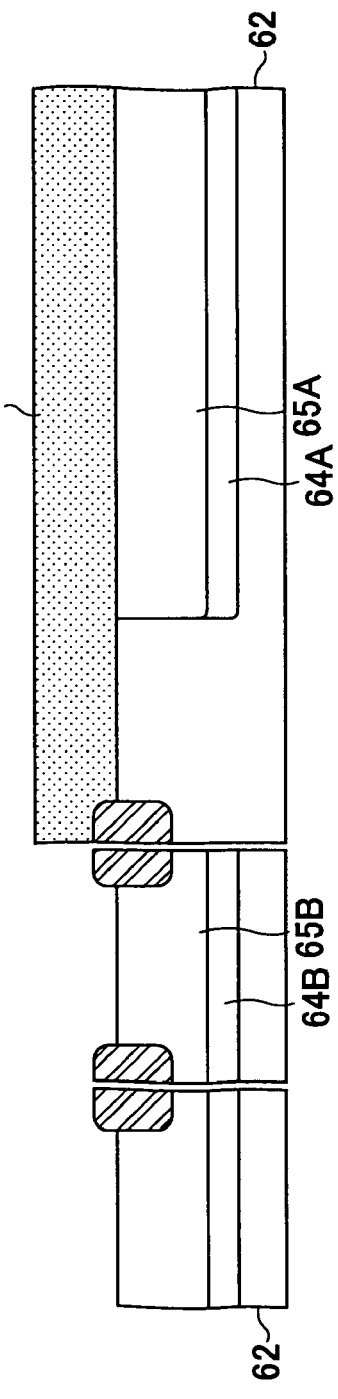

In the step shown in FIG. 10B, a well region 64B is formed in the region in which the transistors 35 and 36 of the peripheral circuit 12 and the input/output circuit 13 are formed. Specifically, a photo-resist 67 is first formed as shown in FIG. 10B by the photo-resist process under conditions described with reference to the step shown in FIG. 7B. Using the same photo-resist 67, a channel region 65A for controlling the threshold value is formed in the same manner as the first embodiment.

Next, a gate dielectric film 70 is formed on the silicon substrate by the thermal oxidization described above with reference to FIG. 7C.

Figure 10C:
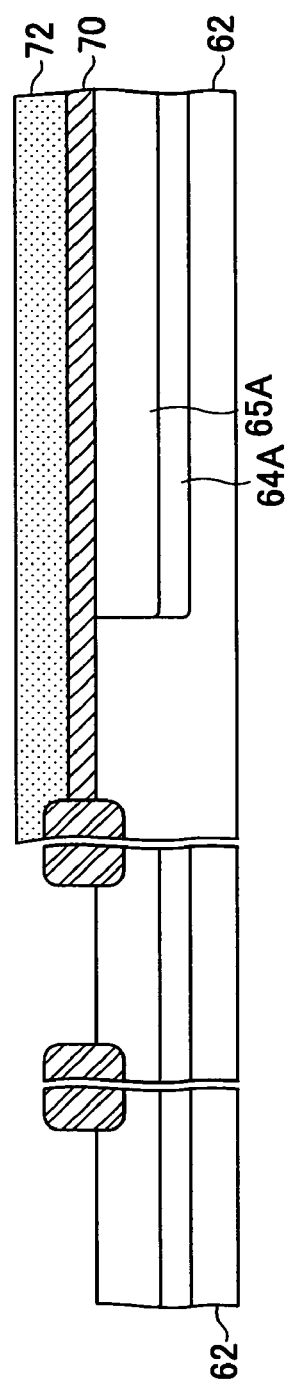

In the step shown in FIG. 10C, in a photo-resist process, the regions in which the three transistors 32-34 are formed in the pixel cell 14 is masked with a photo-resist 72. The gate dielectric film 70 of the regions in which the transistors 35 and 36 of the peripheral circuit 12 and the input/output circuit 13 are formed is removed by HF processing and persulfuric acid processing. Next, the thermal oxidation process is applied as described with reference to the step shown in FIG. 7E. Consequently, a gate dielectric film 60A of 6 nm thickness or more is formed in the region in which the three transistors 32-34 are to be formed. Likewise, a gate dielectric film 60B of 2.5-6 nm thickness is formed in the region in which the the transistors 35 and 36 of the peripheral circuit 12 and the input/output circuit 13.

Figure 10D:
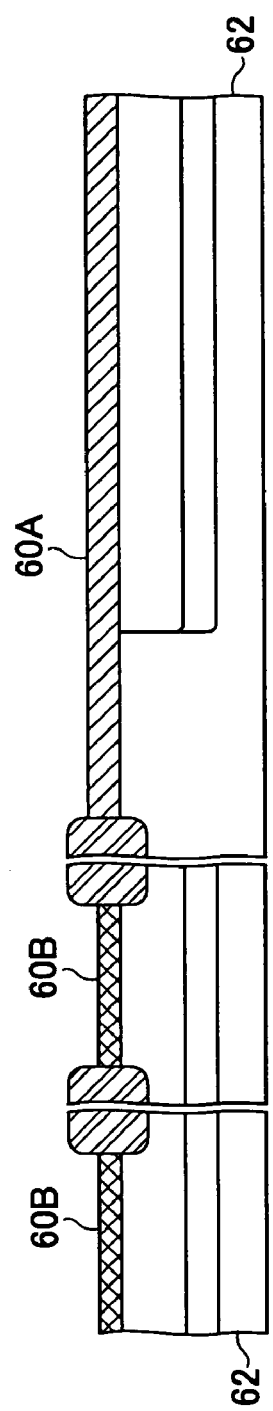

Next, in the step shown in FIG. 10D, the steps according to the first embodiment shown in FIGS. 7F-7I are performed. Ion is injected to the LDD region 82A and the source/drain region 88A of the three transistors 32-34 in the pixel cell 14 under the same condition as the reset transistor 32 and the detection transistor 33 according to the first embodiment. On the other hand, ion is injected to the LDD region 82B and the source/drain region 88B of the transistors 35 and 36 in the peripheral circuit 12 and the input/output circuit 13 under the same condition as the transistor 35 in the peripheral circuit 12 according to the first embodiment. As illustrated for the first embodiment, the gate length is determined in accordance with the thickness of the gate dielectric film 60A and 60B. Following the above steps, one can fabricate the CMOS image sensor 100 according to the present embodiment.

As described above, according to the present embodiment, the selection transistor 34, as well as the reset transistor 32 and the detection transistor 33, has a thick gate dielectric film 60B. Thus, even if a select signal higher than the power supply voltage is applied to the gate electrode 77 of the selection transistor 34, the gate leakage current is prevented from being increased. As a result, it is possible to reduce the dispersion of the signal voltage from the photo diode 31 caused by the dispersion of the threshold value of the selection transistor 34. The similar effects to those of the first embodiment can be obtained.

Third Embodiment

A CMOS image sensor according to the third embodiment has a reset transistor in a pixel cell, the gate dielectric film of which is thicker than that of the detection transistor, the selection transistor, and the transistors of the peripheral circuit.

Figure 11:
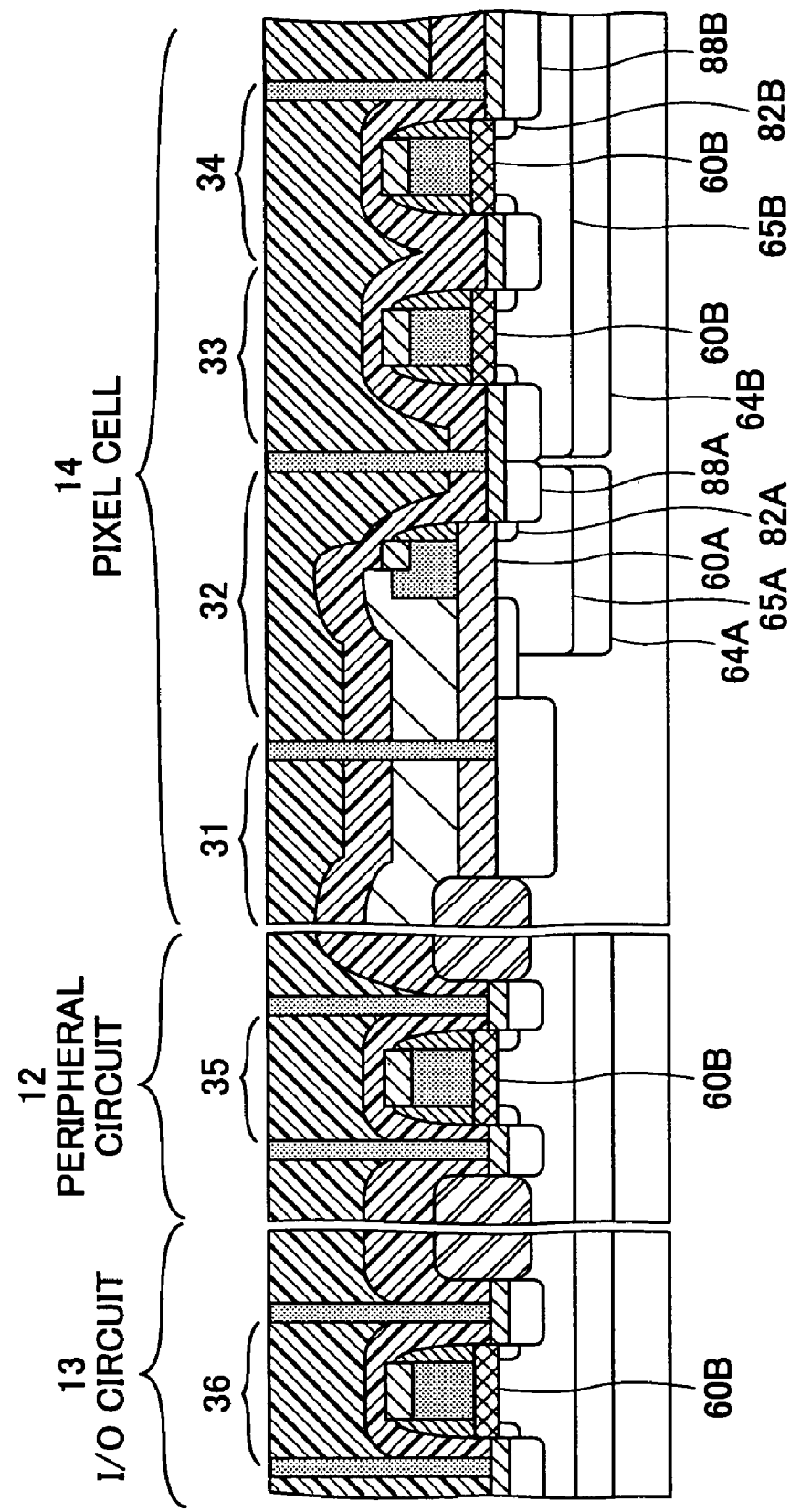
FIG. 11 is a cross section showing a CMOS image sensor according to the third embodiment of the present invention.

FIG. 11 is a cross-sectional view of the CMOS image sensor 110 according to the present embodiment. FIG. 11 shows components in the pixel cell 14, some of components in the peripheral circuit 12 and input/output circuit 13. In the following description, components corresponding to those described above are referred to by the same reference symbols, and their description will be omitted.

Referring to FIG. 11, the CMOS image sensor 110 includes the pixel cell 14 having a photo diode 31 and three n-channel MOS transistors, the peripheral circuit 12 and input/output circuit 13 having MOS transistors. This CMOS image sensor 110 is especially characterized in that the reset transistor 32 has a thick gate dielectric film 60A. Contrarily, the detection transistor 33, the selection transistor 34, the MOS transistors 35, 36 of the peripheral circuit 12 and the input/output circuit 13 have a thin gate dielectric film with less gate length by applying finer rule process. It is noted that, among transistors in the peripheral circuit 12, the transistor in the driving circuit 15 shown in FIG. 3 to which a high-voltage reset signal is applied has a thick gate dielectric film 60A.

The CMOS image sensor 110 according to the present embodiment can be readily fabricated in the same manner as the CMOS image sensors according to the first and second embodiments.

For example, the well region 64A of the reset transistor 32 has lower impurity density than the well region 64B of the other transistors. The present embodiment uses the same ion injection conditions as the first embodiment shown in FIGS. 7A and 7B. Such a low impurity density in the well region 64A of the reset transistor 32 results in the same effect as the first embodiment.

The gate dielectric film 60A, LDD region 84A, and source/drain region 84B of the reset transistor 32 is formed under the same condition as the first embodiment.

According to the present embodiment, the gate dielectric film 60A of the reset transistor 32 in the pixel cell 14 is thicker than the dielectric film 60B of the transistors 33-36. Thus, the transistors with a thin gate dielectric film can be made compact thereby to shrink the pixel cell. As a result, the pixel cell can be integrated at larger scale, and the image quality, operation speed, and power consumption thereof can be improved. Among the transistors in the peripheral circuit 12, the transistor in the driving circuit 15 to which a high-voltage reset signal is applied shown in FIG. 3, for example, may have a thick gate dielectric film 60A. Such a transistor can reduce the gate leakage current.

Fourth Embodiment

A CMOS image sensor according to the present embodiment has a detection transistor in a pixel cell, the gate dielectric film of which is thicker than those of a reset transistor, a selection transistor, transistors in a peripheral circuit.

Figure 12:
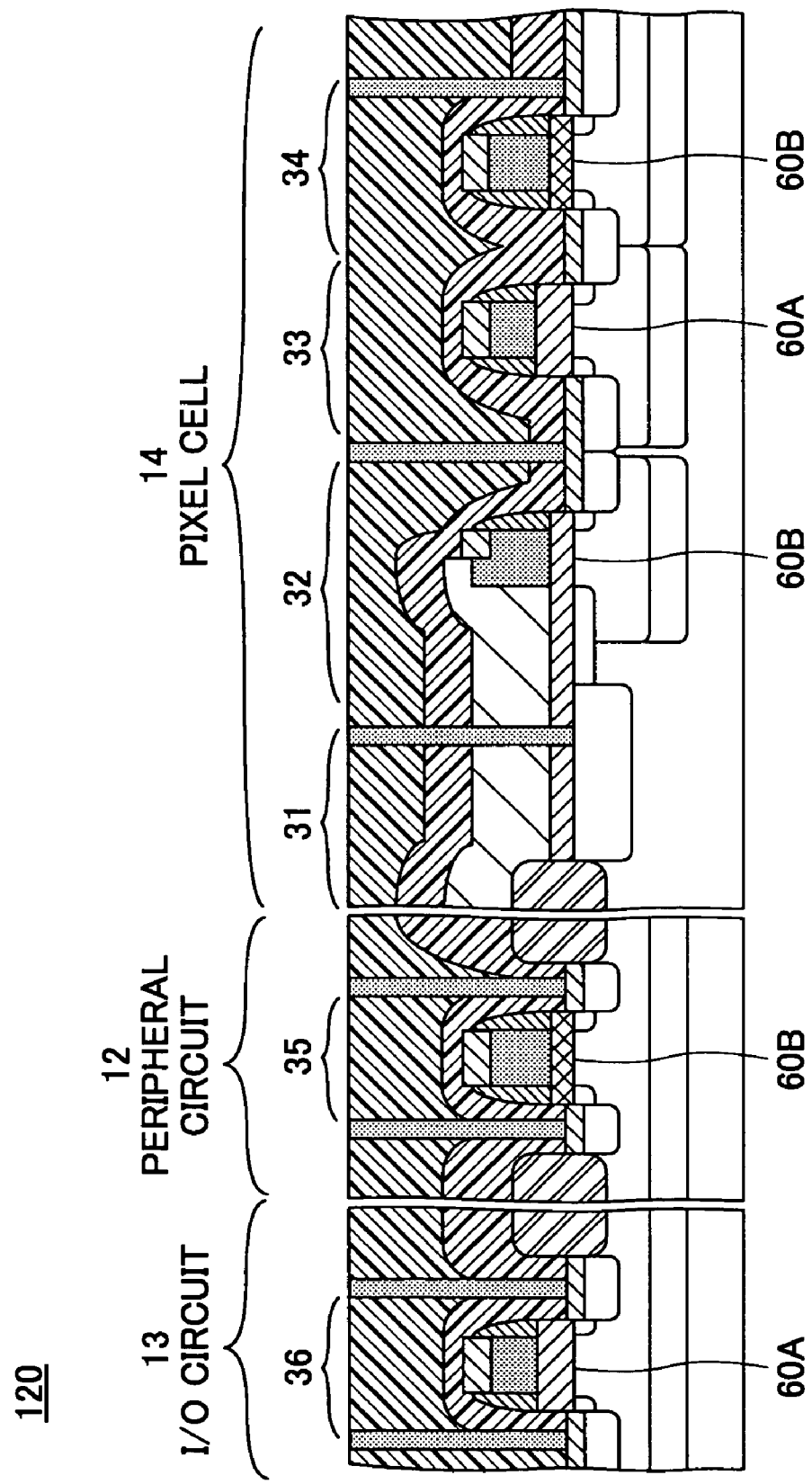
FIG. 12 is a cross section showing a CMOS image sensor according to the fourth embodiment of the present invention.

FIG. 12 is a cross-sectional view of the CMOS image sensor according to the present embodiment. FIG. 12 shows components in the pixel cell 14, some of components in the peripheral circuit 12 and the input/output circuit 13. In the following description, portions corresponding to the portions described above are referred to by the same reference symbols, and their description is omitted.

Referring to FIG. 12, the CMOS image sensor 120 includes a photo diode 31, the pixel cell 14 having three n-channel MOS transistors, and the peripheral circuit 12 and the input/output circuit 13 having MOS transistors. The CMOS image sensor 120 is especially characterized in that the detection transistor 33 has a thick gate dielectric film 60A, whereas the reset transistor 32, the selection transistor 34, and the MOS transistors of the peripheral circuit 12 have thin gate dielectric film formed by a finer rule process, and their gate length is short.

The CMOS image sensor 120 can be easily fabricated using the steps according to the first and second embodiments described above.

For example, the well region 64A of the detection transistor 33 is lower in impurity density than the well regions 64B of the other transistors. The same ion injection condition as that of the first embodiment described with reference to FIGS. 7A and 7B is applied to the present embodiment. Because the impurity density of the well region 64A of the detection transistor 33 is reduced, the junction capacitance of the drain region is lowered, which results in the increase in operation speed.

The gate dielectric film 60A, LDD region 84A, and source/drain region 84B of the detection transistor 33 is formed under the same condition as the first embodiment.

Because the gate dielectric film 60B of the reset transistor 32 is thin, 2.5-6 nm, for example, problem may arise such that a high level reset signal cannot be applied to the gate of the reset transistor 32, and consequently, the dispersion in properties such as threshold voltage may affected the voltage of photo diode. However, even in the case in which the power supply voltage is 2 V or less, if the threshold voltage of the reset transistor 32 is set at 0.2-0.5 V, for example, by reducing the gate length, the cathode of the photo diode 31 can be reset without being affected by the dispersion of the threshold voltage using 2.5~2.8V as the gate voltage of the reset transistor.

According to the present embodiment, the detection transistor 33 in the pixel cell 14 is formed with a thick gate dielectric film, whereas the reset transistor 32, the selection transistor 33, and the transistors of the peripheral circuit 12 are formed with a thinner gate dielectric film than that of the detection transistor 33. According to the above arrangement, the gate length of transistors having a thin gate dielectric film can be shortened, and consequently, the pixel cell can be made compact. Likewise, the peripheral circuit 12 and the input/output circuit 13 can be also made compact. As a result, the pixel cell can be integrated at a larger scale, and the image quality, operation speed, and power consumption thereof can be improved.

Fifth Embodiment

A CMOS image sensor according to the fifth embodiment has transistors in a pixel cell and a peripheral circuit having thinner gate dielectric film than that of a transistor in the input/output circuit.

Figure 13:
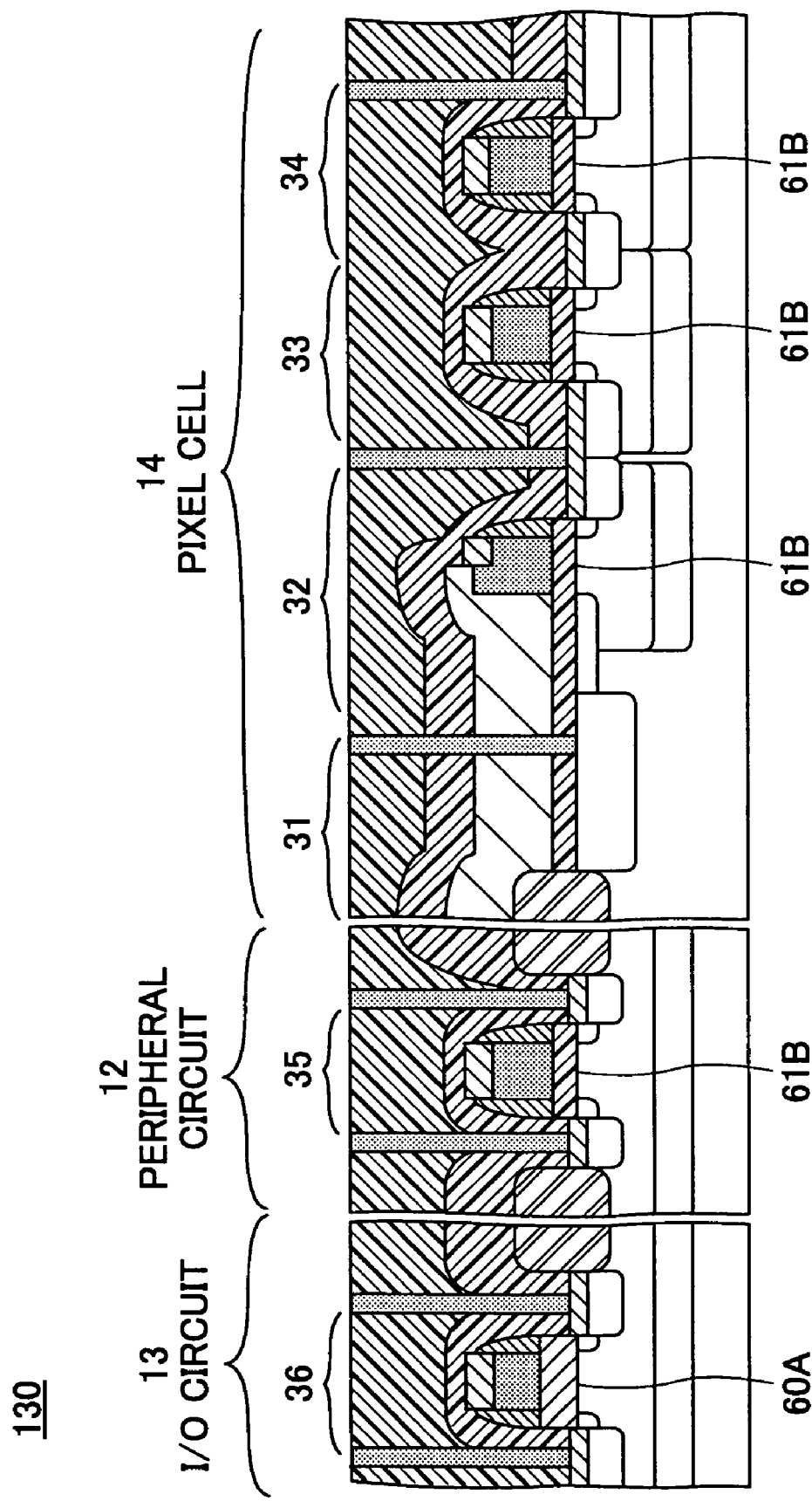
FIG. 13 is a cross section showing a CMOS image sensor according to the fifth embodiment of the present invention.

FIG. 13 is a cross-sectional view of the CMOS image sensor 130 according to the present embodiment. FIG. 13 shows components in the pixel cell 14, and some of components in the peripheral circuit 12 and input/output circuit 13. Portions corresponding to those described above are referred to by the same reference symbols, and their description is omitted.

Referring to FIG. 13, the CMOS image sensor 130 includes the pixel cell 14 having a photo diode 31 and three n-channel MOS transistors, the peripheral circuit 12 having MOS transistors, and the input/output circuit 13 having MOS transistors. The CMOS image sensor 130 is especially characterized in that the three transistors in the pixel cell 14 and the transistor in the peripheral circuit 12 are formed with thin gate dielectric film 61B, and the MOS transistor in the input/output circuit 13 is formed with thick gate dielectric film 60A.

According to the above arrangement, the MOS transistors in the pixel cell 14 and the peripheral circuit 12 can have a gate with short gate length by applying finer rule process, and can be made compact. As a result, the pixel cell 14 and the peripheral circuit 12 can be made compact and highly integrated. On the other hand, if the gate dielectric film 61B becomes thin, for example, about 2 nm, the gate leakage current may increase. To avoid this problem, the gate dielectric film 61B may be formed with silicon oxinitride film or silicon nitride film. Such a film is more dense than a silicon film and includes less dangling bond, which results in the gate dielectric film 61B being made thin without increasing the gate leakage current.

The silicon nitride film can be formed by CVD method, for example. The silicon oxinitride film may be converted from a silicon oxide film formed by the CVD method or the thermal oxidation method by plasma nitride process.

Referring FIGS. 14A-14C and FIG. 15, the fabrication process of the CMOS image sensor 130 according to the present embodiment is described.

FIGS. 14A-14C shows the steps of the fabrication process of the CMOS image sensor 130 according to the present embodiment.

In the step of FIG. 14A, isolation regions 63 are formed in the same manner as the step shown in FIG. 7A for the first embodiment. Then, ion is injected for forming well regions. The well region 64B in the region in which three transistors 32-34 are formed in the pixel cell 14 and the region in which a transistor 36 of the peripheral circuit 12 is formed is set higher in impurity density than the well region 64A in the region in which the transistors of the input/output circuit 13 is formed. More specifically, the ion injection is performed under the same condition as the steps shown in FIGS. 7A and 7B thereby to form the well regions 64A and 64B. Likewise, channel region 65A and 65B for controlling threshold value are formed.

In the step shown in FIG. 14B, in the same manner as the step shown in FIGS. 7C-7E, gate dielectric films 60B having 2.5-6 nm thick silicon oxide film are formed in the region in which the transistors for the pixel cell 14 and the peripheral circuit 12 are formed. A gate dielectric film 60A having 6 nm-thick or more silicon oxide film is formed in the region in which the transistor for the input/output circuit 13 is formed.

In the step shown in FIG. 14B, the region in which the transistor for the input/output circuit 13 is formed is masked with photo-resist 131 by photo-resist process. Next, the silicon oxide film of the gate dielectric film 60B is converted into a gate oxinitride film 61B having silicon oxinitride film by plasma nitride process. More specifically, nitrogen radical N* is generated using the plasma generator of a remote plasma apparatus. The generated nitrogen radical N* is introduced into a chamber in which silicon substrate maintained at a temperature between 20-600 deg-C. is located. The chemical reaction between the introduced nitrogen radical N* and the silicon oxide film of the gate dielectric film 60B is induced.

As a result, as shown in FIG. 14C, a gate dielectric film 61B having 2.5-6 nm thick silicon oxinitride film for the transistors 32-35 of the pixel cell 14 and the peripheral circuit 12, whereas a gate dielectric film 60A having 6-nm thick or more silicon oxide film is formed for the transistor 36 of the input/output circuit 13.

Next, similar steps to those shown in FIGS. 7F-7I for the first embodiment are performed. According to the above steps, the CMOS image sensor 130 according to the present embodiment is formed.

According to the present embodiment, the gate dielectric films 61B of the three transistors in the pixel cell 14 and the transistor in the peripheral circuit 12 are thin silicon oxinitride film. Consequently, the transistors can be made compact as well as the pixel cell without increasing the gate leakage current. As a result, the pixel cell can be integrated at larger scale, and the image quality, operation speed, and power consumption thereof can be improved. On the other hand, because the gate dielectric film 60A of the transistor 36 in the input/output circuit 13 is made thick, a high voltage is applicable to the gate electrode without increasing the gate leakage current. Additionally, a voltage down-converter circuit for generating a voltage lower than the power supply voltage provided from an exterior and for providing the generated voltage to the internal circuit such as the peripheral circuit 12 and the pixel cell 14. If the CMOS image sensor 130 is driven by the lowered voltage, the power consumption can be further reduced.

Sixth Embodiment

A CMOS image sensor according to the sixth embodiment shown in FIG. 3 is further provided with a power supply voltage booster circuit.

FIG. 15 is a schematic diagram showing the CMOS image sensor having the power supply voltage booster circuit. In FIG. 15, portions corresponding to those described above are referred to by the same reference symbols, and their description is omitted.

Referring to FIG. 15, the CMOS image sensor 140 includes a photo detecting unit 11, a peripheral circuit 12, and an input/output circuit 13. In the input/output circuit 13, there is a power supply booster circuit 141 provided therein.

The power supply voltage booster circuit 141 boosts, for example, the 1.8V external power supply voltage to 2.5V or more, for example, 3.3V, and provides the boosted power supply voltage to the driving circuit 15 for driving the reset signal line 18. Consequently, 3.3 V reset signal can be provided to the reset transistor 32. The gate dielectric film of the CMOS transistor in the power supply voltage booster circuit 141 may be of thickness of 6 nm or more as described with respect to the first embodiment. Likewise, the CMOS transistor of the driving circuit 15 may use a gate dielectric film of thickness of 6 nm or more. According to the above arrangements, the CMOS transistor can operate at high reliability even if signal voltage is 2.5 V or more.

Figure 16:
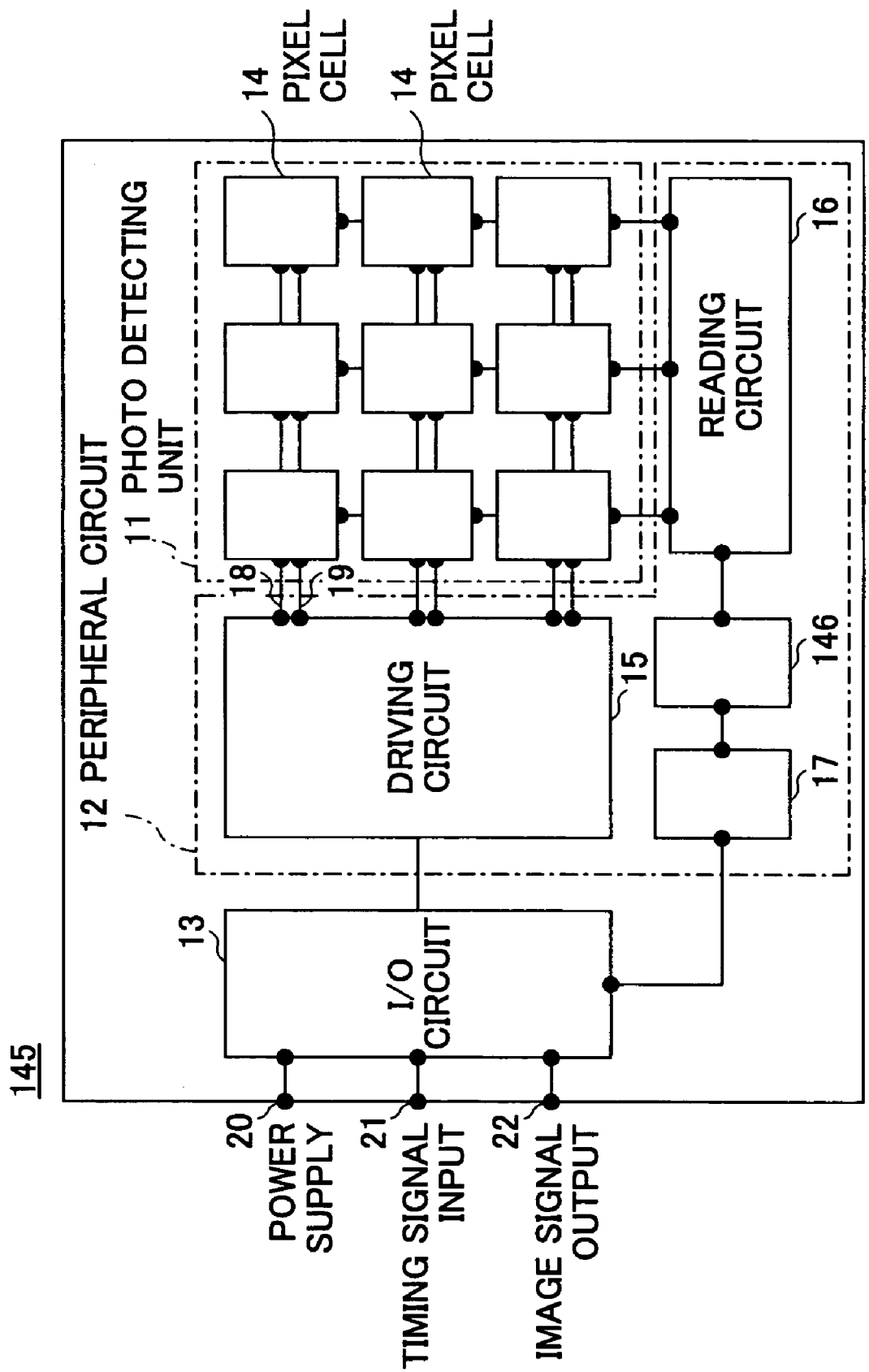
FIG. 16 is a schematic diagram showing the construction of a CMOS image sensor according to a variation of the sixth embodiment of the present invention.

FIG. 16 is a schematic diagram showing a CMOS image sensor that is provided with an analog processing circuit in the peripheral circuit 12 according to a variation of the present embodiment.

Referring to FIG. 16, the CMOS image sensor 145 is provided with an analog processing circuit 146 between a signal reading circuit 16 and an A/D converter 17 in the peripheral circuit 12. The analog processing circuit 146 includes a noise reduction circuit and an automatic gain control amp (AGC), for example, and improves the quality of analog image signal. The image signal is converted into a digital signal by the A/D converter 17, and transmitted to the input/output circuit 13. A thick gate dielectric film 60A may be used for the transistor of the A/D converter 17 so that the A/D converter can accept high voltage signal.

Figure 17:
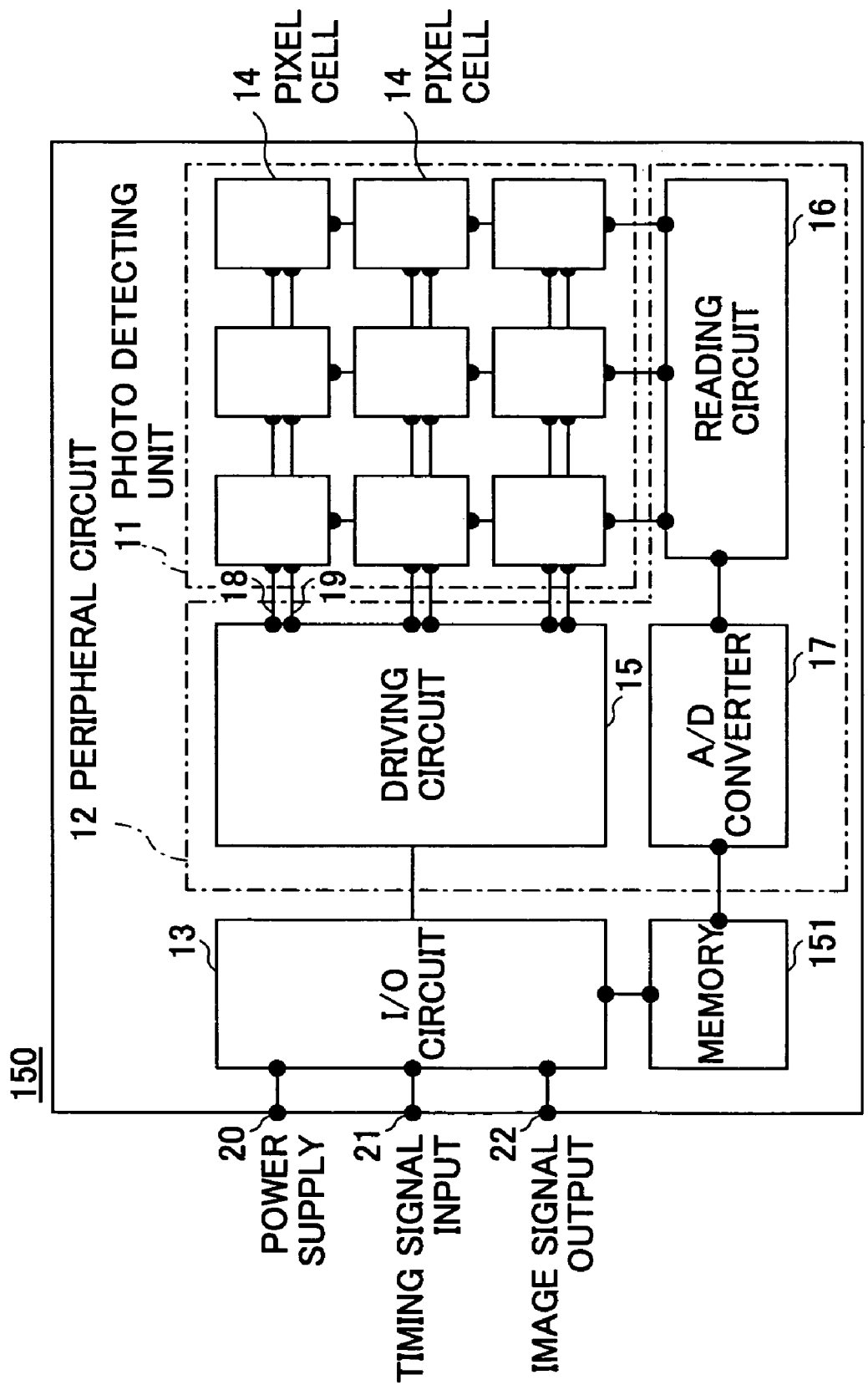
FIG. 17 is a schematic diagram showing the construction of a CMOS image sensor according to another variation of the sixth embodiment of the present invention.

FIG. 17 is a schematic diagram showing a CMOS image sensor that is provided with a memory unit according to a variation of the present embodiment.

Referring to FIG. 17, the CMOS image sensor 150 is configured such that the memory unit 151 is connected to the A/D converter 17. The memory unit 151 includes flash memory and/or DRAM, for example. The memory unit 151 stores the digital data of an image signal transmitted from the A/D converter 17, and outputs the stored digital data to an exterior via an image signal output unit 22 of the input/output circuit 13, if required. High gate voltage may be applied to the cell unit of the memory unit 151. Such cell unit of the memory 151 may use the thick gate dielectric film 60A described with respect to the first through fifth embodiments. Consequently, the memory unit can be embedded in the CMOS image sensor 150 without increasing the number of steps.

The photo detecting unit 11, the peripheral circuit 12, and the input/output circuit 13 according to the first through fifth embodiments can be used for the present embodiment and its variations.

Seventh Embodiment

The seventh embodiment illustrates an image sensor module in which the CMOS image sensor and an optical lens, for example, are built together.

Figure 18:
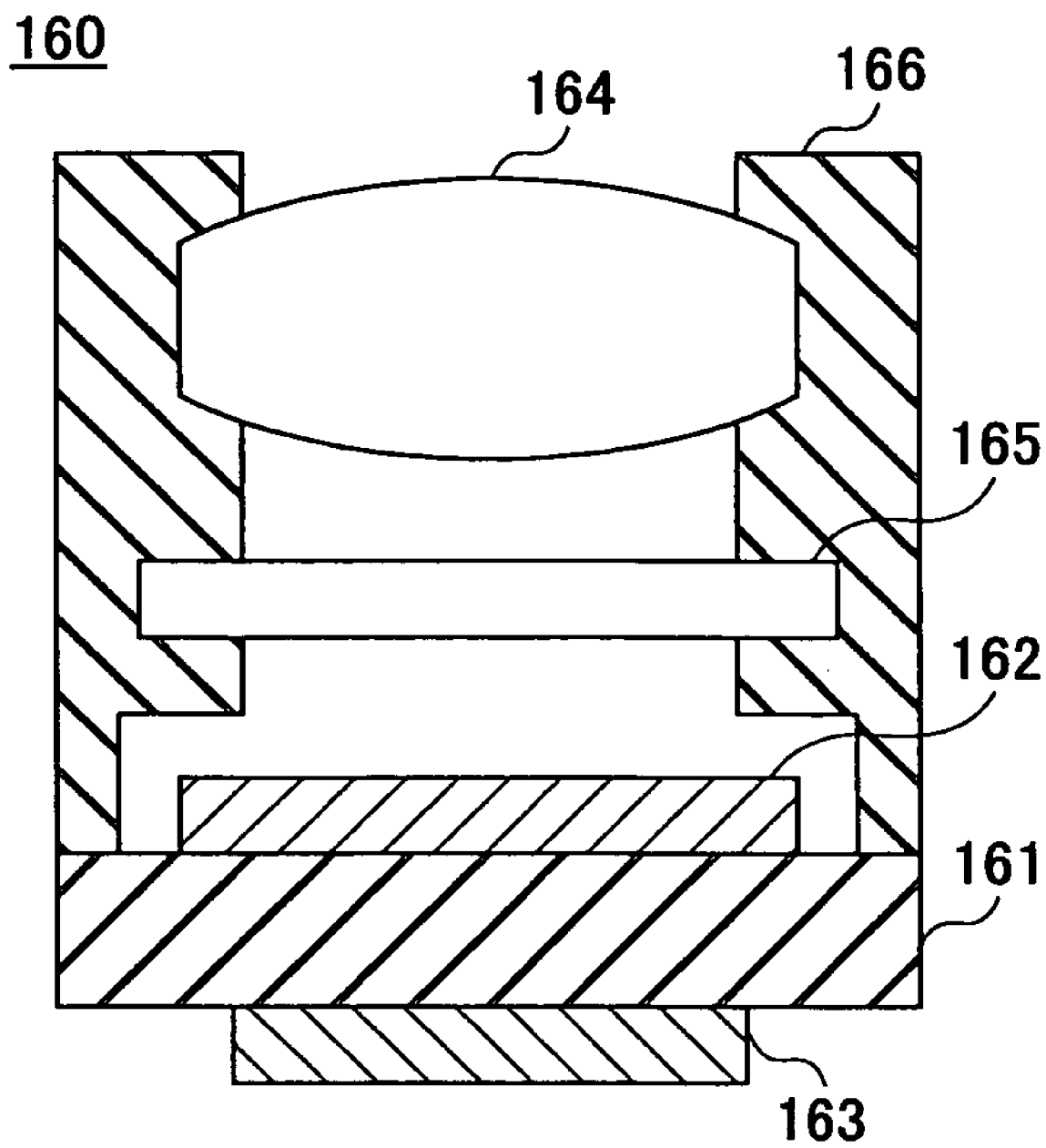
FIG. 18 is a cross section of showing an image sensor module according to the seventh embodiment of the present invention.

FIG. 18 is a cross-sectional view of the image sensor module in which the CMOS image sensor is provided according to the present embodiment.

Referring to FIG. 18, the image sensor module 160 includes a substrate 161, a CMOS image sensor implemented on the substrate 161, a signal processing IC 163 for processing signal from the CMOS image sensor 162, a lens 164 for converging the light reflected by an object, a filter 165 for cutting ultraviolet rays, for example, and chassis 166.

The lens 164 converges the light reflected by the object, and the filter 165 cuts ultraviolet rays or infrared rays. The CMOS image sensor 162 converts an image into a voltage signal, and the voltage signal is further converted from analog into digital. The digital signal is transmitted to the signal processing IC 163, and reconstructed as an image. This embodiment is characterized by the CMOS image sensor 162. One of the CMOS image sensors according to the first through sixth embodiments is used. Since the optical lens 164 and the signal processing IC 163 are known to the art, it is not necessary to provide detailed description thereof.

Preferred embodiment of the present invention has been described in detail. Those skilled in the art, however, will recognize that the present invention is not limited to those embodiments, but variations and modifications can be made without departing from the scope of the appended claims.

For example, as illustrated in the first through fifth embodiment, As+ is injected into the LDD region and source/drain region of the n-channel MOS transistor of the peripheral circuit 12, however, P+ may be injected instead in order to reduce the junction capacitance of the source/drain region and increase the operation speed. Additionally, because the number of steps can be reduced, the cost can be reduced.

Figure 19:
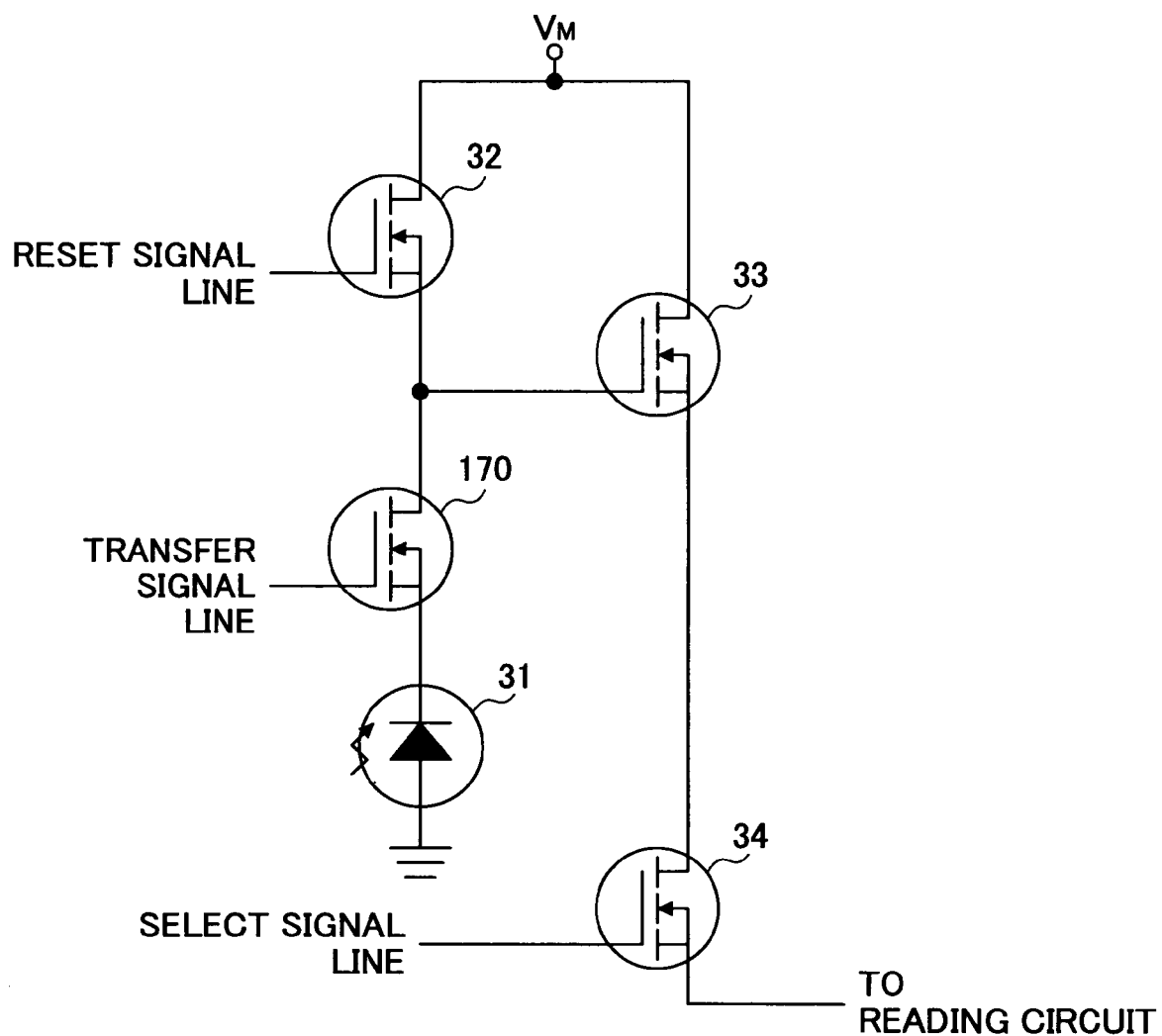
FIG. 19 is a circuit diagram showing the equivalent circuit of a pixel cell including four transistors according to the eighth embodiment of the present invention.

Exemplary embodiments in which a pixel cell is formed with three transistors is described above. However, as shown in an equivalent circuit shown in FIG. 19, an image sensor may include four transistors such that a transfer transistor 170 is connected in series between the photo diode 31 and the detection transistor 32, and the first through fifth embodiments are still applicable thereto.

Figure 20:
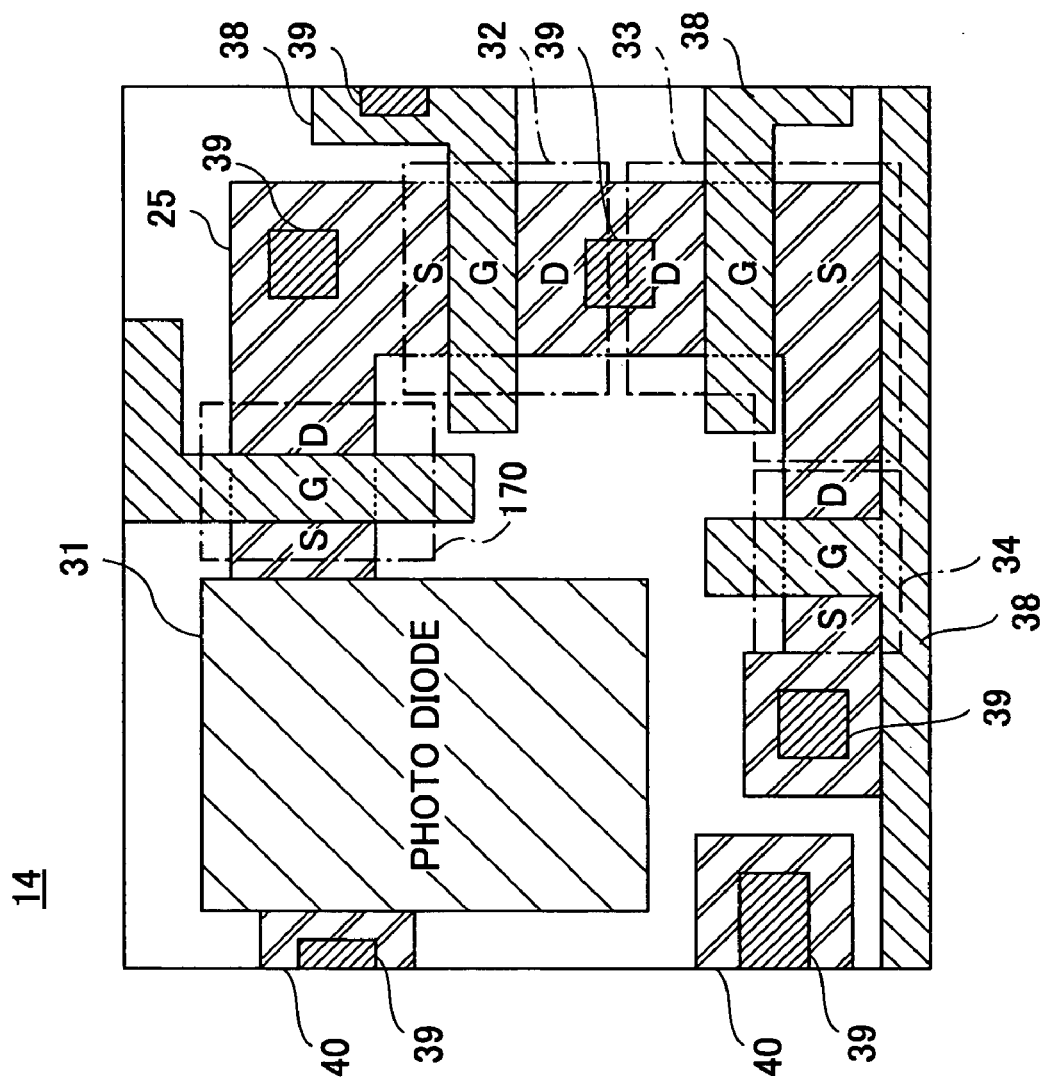
FIG. 20 is a schematic diagram showing the layout of a pixel cell 14 according to another embodiment of the present invention.

FIG. 20 shows the layout of a pixel cell including four transistors. The transfer transistor 170 is provided between the photo diode 31 and the reset transistor 32. Elements other than the transfer transistor 170 are identical to those shown in FIG. 5, and their description will be omitted.

The diffusion layer connecting the drain of the transfer transistor 170 and the source of the reset transistor 32 is called floating diffusion. The gate of the detection transistor 33 is also connected to the floating diffusion.

The transfer transistor 170 controls the transfer of the charge generated by the photo diode 31 to the floating diffusion in response to a transfer signal input to the gate thereof. In the case in which the gate dielectric film is made thin, and consequently, high enough voltage cannot be applied to the gate of the transfer transistor 170 in order to secure reliability, the above transfer may become insufficient. If the charge cannot be transferred enough, un-transferred charge may remain in the photo diode 31, which results in the degradation of image quality due to less sensitivity and/or an incidental image. In addition, if the gate oxide film is made thin, and the gate leakage current of the transfer transistor 170 becomes great, the gate leakage current may affect the transferred signal charge as noise charge, which results in the degradation of image quality. Therefore, the image quality of the CMOS image sensor can be improved by using a thick gate dielectric film for the transfer transistor 170 constituting the four transistor pixel shown in FIGS. 19 and 20 as well as the other three transistors 32-34, or independently. For example, the gate dielectric film of the transfer transistor 170 may be thicker than that of the selection transistor 34, or may be thicker than that of the other three transistors 32-34. Alternatively, the gate dielectric film of the four transistors may be thicker than that of the transistors in the peripheral circuit.

When a thick gate dielectric film is used for the transfer transistor 170, the impurity density of the well of the transfer transistor 170 is made lower than that of the well of transistor in which a thin gate dielectric film is used. If the drain region of the transfer transistor 170 (floating diffusion) is formed by injecting P+, the junction capacitance and junction leakage current of the depletion layer formed between the drain region (floating diffusion) and the substrate can be reduced, which results in improved operation speed of the transfer transistor 170.

As is apparent from the above detailed description, the present invention provides an image sensor that can be made compact, lower power consuming, and operative at high speed without degrading image quality and read-out speed, and an image sensor module.

The present invention is not limited to these embodiments, but various variations and modifications may be made without departing from the scope of the present invention.

This patent application is based on Japanese priority patent applications No. 2002-214477 filed on Jul. 23, 2002, and International Application No. PCT/JP03/09342 filed on Jul. 23, 2003, the entire contents of which are hereby incorporated by reference.

What is claimed is:

1. An image sensor, comprising:
a reset transistor;
a photo diode;
a transfer transistor serially connected between said reset transistor and said photo diode;
a detecting transistor, a gate of which is connected to a diffusion region connecting said reset transistor and said transfer transistor;
a selecting transistor that selects said detecting transistor; and
a peripheral transistor constructing a peripheral circuit;
wherein
a gate dielectrics of said transfer transistor is thicker than a gate dielectrics of said reset transistor, said detection transistor, and said selection transistor.

2. The image sensor as claimed in claim 1, wherein phosphorus is injected into a drain region of said transfer transistor.

* * * * *